(12) United States Patent
Nasu et al.

(10) Patent No.: US 10,985,030 B2
(45) Date of Patent: Apr. 20, 2021

(54) METHOD FOR MANUFACTURING SEMICONDUCTOR DEVICE

(71) Applicant: Rohm Co., Ltd., Kyoto (JP)

(72) Inventors: Kentaro Nasu, Kyoto (JP); Kanako Deguchi, Kyoto (JP)

(73) Assignee: ROHM CO., LTD, Kyoto (JP)

( * ) Notice: Subject to any disclaimer, the term of this patent is extended or adjusted under 35 U.S.C. 154(b) by 7 days.

(21) Appl. No.: 16/684,817

(22) Filed: Nov. 15, 2019

(65) Prior Publication Data
US 2020/0176271 A1 Jun. 4, 2020

(30) Foreign Application Priority Data
Nov. 19, 2018 (JP) .............................. JP2018-216561

(51) Int. Cl.
*H01L 21/44* (2006.01)
*H01L 21/48* (2006.01)
(Continued)

(52) U.S. Cl.
CPC .... *H01L 21/4821* (2013.01); *H01L 21/02021* (2013.01); *H01L 21/304* (2013.01); *H01L 21/4828* (2013.01); *H01L 21/4842* (2013.01); *H01L 21/56* (2013.01); *H01L 23/3121* (2013.01); *H01L 23/49548* (2013.01)

(58) Field of Classification Search
CPC . H01L 21/4842; H01L 21/56; H01L 23/3121; H01L 23/49548; H01L 21/4828; H01L 2224/48465; H01L 2224/0603; H01L 2224/49111; H01L 2224/48247; H01L 2224/97; H01L 2924/181; H01L 2223/54453; H01L 2223/54426; H01L 23/544; H01L 21/561; H01L 23/49582; H01L 23/49562; H01L 21/78; H01L 21/304; H01L 21/3043; H01L 21/4821; H01L 21/02021
See application file for complete search history.

(56) References Cited

U.S. PATENT DOCUMENTS 7,023,074 B2 * 4/2006 Li .................... H01L 23/3107
257/666
9,899,349 B2 * 2/2018 Celaya .................. H01L 21/561
(Continued)

FOREIGN PATENT DOCUMENTS

JP 2007-123327 A 5/2007
JP 2014-183142 A 9/2014

*Primary Examiner* — Shouxiang Hu
(74) *Attorney, Agent, or Firm* — Hamre, Schumann, Mueller & Larson P.C.

(57) ABSTRACT

A method for manufacturing a semiconductor device includes preparing a lead frame, mounting a semiconductor element on an obverse face of the lead frame, forming a sealing resin covering the semiconductor element, forming a groove on a reverse face of the lead frame, and removing a portion of the lead frame and a portion of the sealing resin along a disposal region that is narrower than the groove and entirely overlaps with the groove. The preparing of the lead frame includes forming at least one recess located in the disposal region and having an end that is open in the thickness direction. The forming of the groove includes exposing the recess on a side of the reverse face of the lead frame. The removing is performed with reference to the recess.

13 Claims, 24 Drawing Sheets

(51) Int. Cl.
    *H01L 21/56*     (2006.01)
    *H01L 23/31*     (2006.01)
    *H01L 23/495*     (2006.01)
    *H01L 21/02*     (2006.01)
    *H01L 21/304*     (2006.01)

(56) References Cited

U.S. PATENT DOCUMENTS

| | | | |
|---|---|---|---|
| 10,083,866 B2* | 9/2018 | Bin Mohd Arshad | ........................ H01L 21/78 |
| 2005/0263864 A1* | 12/2005 | Islam | ........................ H01L 21/56 257/676 |
| 2017/0271249 A1* | 9/2017 | Kasuya | ............. H01L 23/49866 |

\* cited by examiner

METHOD FOR MANUFACTURING SEMICONDUCTOR DEVICE

FIELD

The present disclosure relates to a method for manufacturing a semiconductor device.

BACKGROUND

There have been proposed so far various designs regarding semiconductor devices including semiconductor elements such as transistors. An example of such semiconductor devices may include semiconductor elements mounted on a lead and covered with a sealing resin. Such semiconductor devices are manufactured by mounting the semiconductor elements on the lead frame, covering the semiconductor elements with the sealing resin, and then cutting the lead frame and the sealing resin. Some manufacturing methods are designed so as to cut the semiconductor device halfway through a half-cut process, instead of cutting the semiconductor device into individual pieces at a time, perform predetermined processing on the semiconductor device, and then fully cut the semiconductor device into individual pieces. For example, JP-A-2014-183142 discloses a manufacturing method including forming a conductive layer in grooves formed through the half-cut process, and thereafter separating the semiconductor device into individual pieces through the full-cut process. In addition, JP-A-2007-123327 discloses a manufacturing method including cutting leads through the half-cut process, deburring the cut sections, and then separating the semiconductor device into individual pieces through the full-cut process.

According to these manufacturing methods, the half-cut process and the full-cut process are performed utilizing an alignment mark formed on the lead frame as reference. Here, a predetermined tolerance is specified with respect to the cutting position. When the cutting position of the half-cut process is shifted by a maximum tolerance, and the cutting position of the full-cut process is shifted by the maximum tolerance to the opposite side, a positional shift that exceeds the tolerance may be incurred between the cutting position of the half-cut process and the cutting position of the full-cut process.

SUMMARY

In view of the foregoing situation, the present disclosure proposes a method for manufacturing a semiconductor device, arranged so as to prevent a positional shift of a cutting position.

In accordance with an aspect of the present disclosure, there is provided a method for manufacturing a semiconductor device. The method may include: preparing a lead frame having an obverse face and a reverse face spaced apart from each other in a thickness direction; mounting a semiconductor element on the obverse face of the lead frame; forming a sealing resin covering the semiconductor element; forming a groove on the reverse face of the lead frame; and removing a portion of the lead frame and a portion of the sealing resin along a disposal region that is narrower than and overlaps with the groove as viewed in the thickness direction, where the removing is performed with respect to an entirety of the lead frame and the sealing resin in the thickness direction. The preparing of the lead frame may include forming at least one recess in the lead frame, where the recess is located in the disposal region and has an end that is open in the thickness direction. The forming of the groove may include exposing the recess on a side of the reverse face of the lead frame. The removing may include cutting with reference to the recess.

Other features and advantages of the present disclosure will become more apparent, through the detailed description given hereunder with reference to the accompanying drawings.

EMBODIMENTS

Hereafter, exemplary embodiments of the present disclosure will be described in detail, with reference to the drawings.

Referring to FIG. 1 to FIG. 6, a semiconductor device A1 according to a first embodiment of the present disclosure will be described. The semiconductor device A1 includes a plurality of leads 1 to 3, a semiconductor element 6, bonding wires 71 and 72, and a sealing resin 8.

Figure 1:
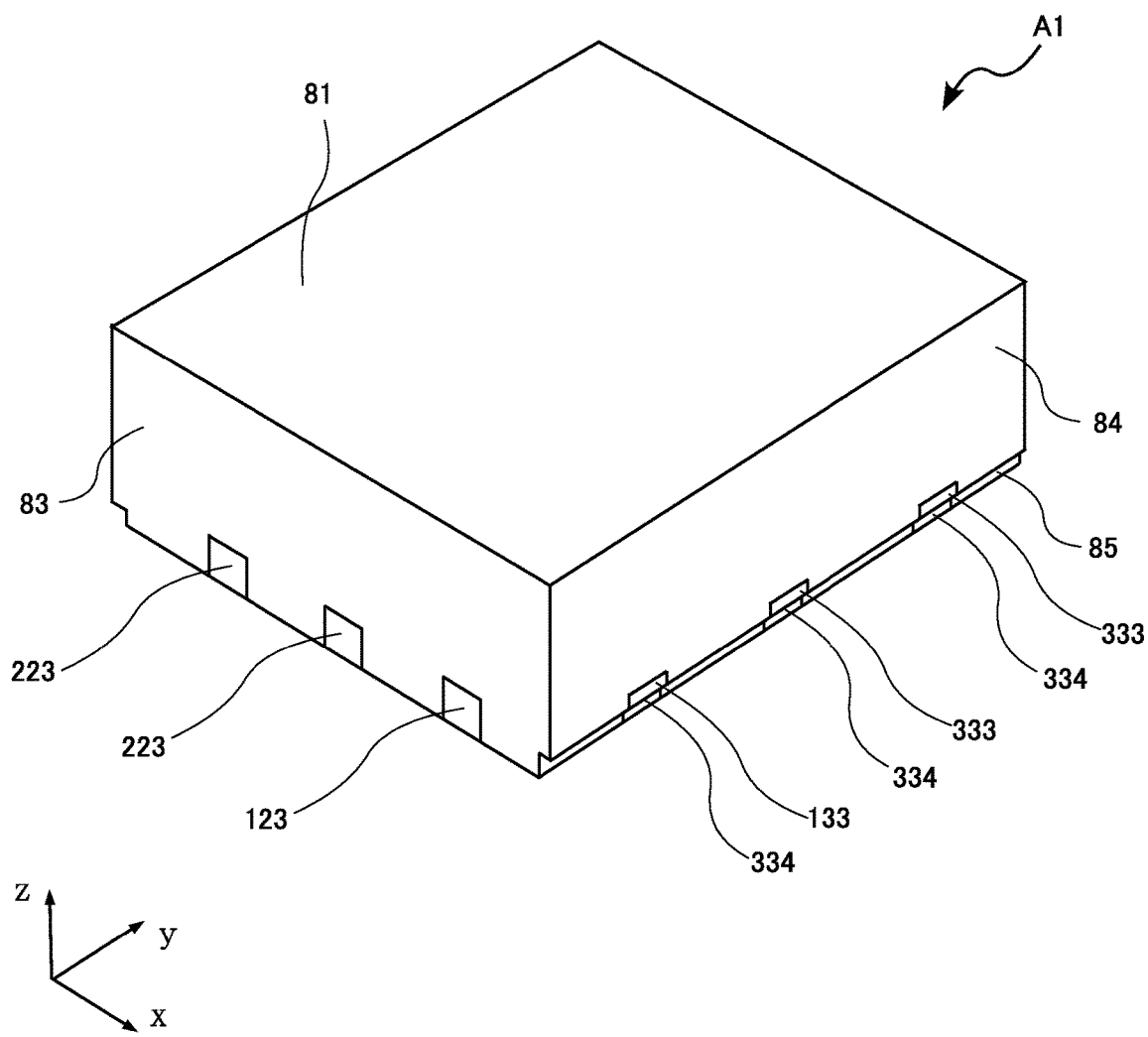
FIG. 1 is a perspective view showing a semiconductor device according to a first embodiment of the present disclosure.
Figure 2:
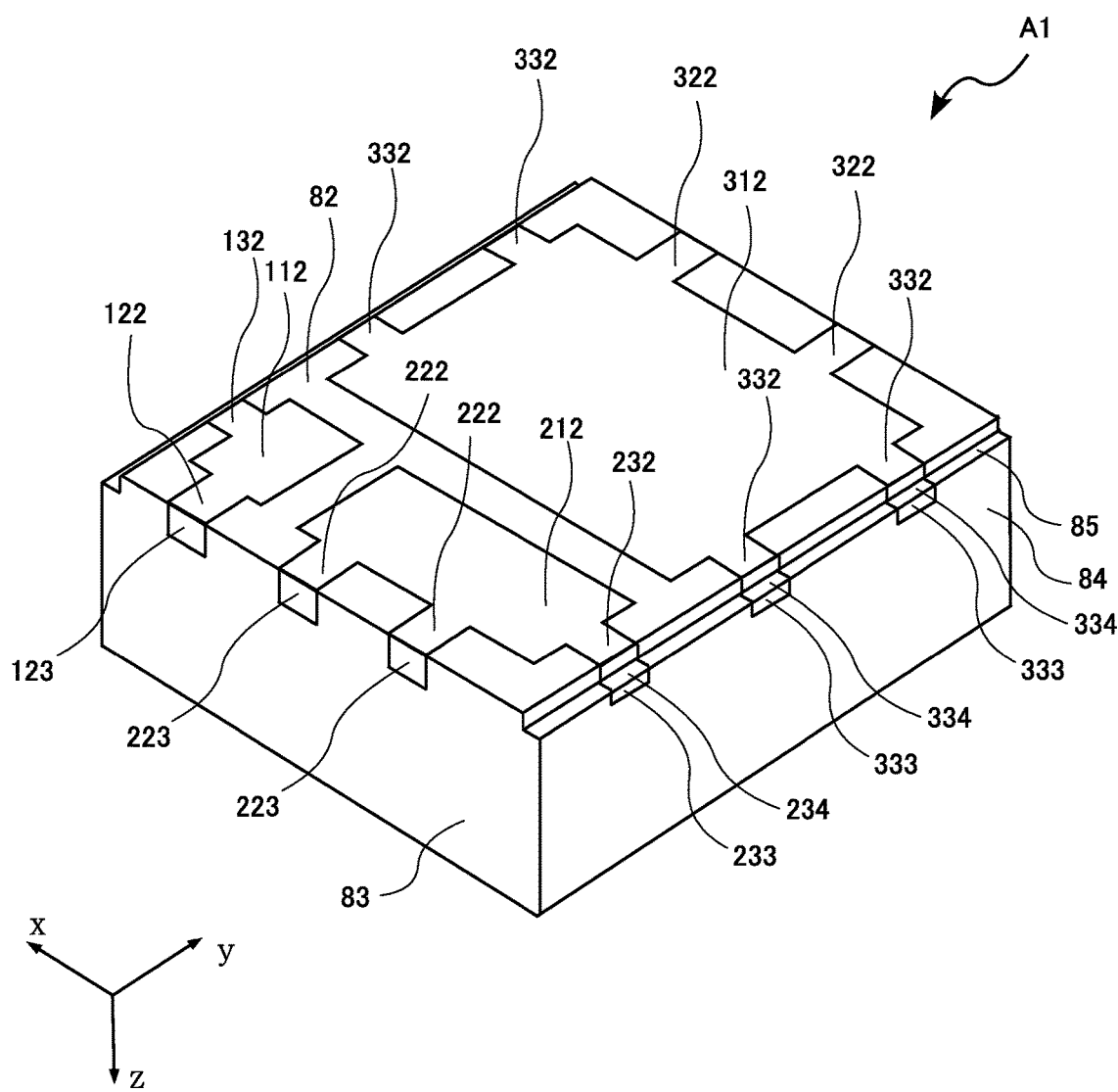
FIG. 2 is a perspective view showing the semiconductor device shown in FIG. 1, with the bottom face oriented upward.
Figure 3:
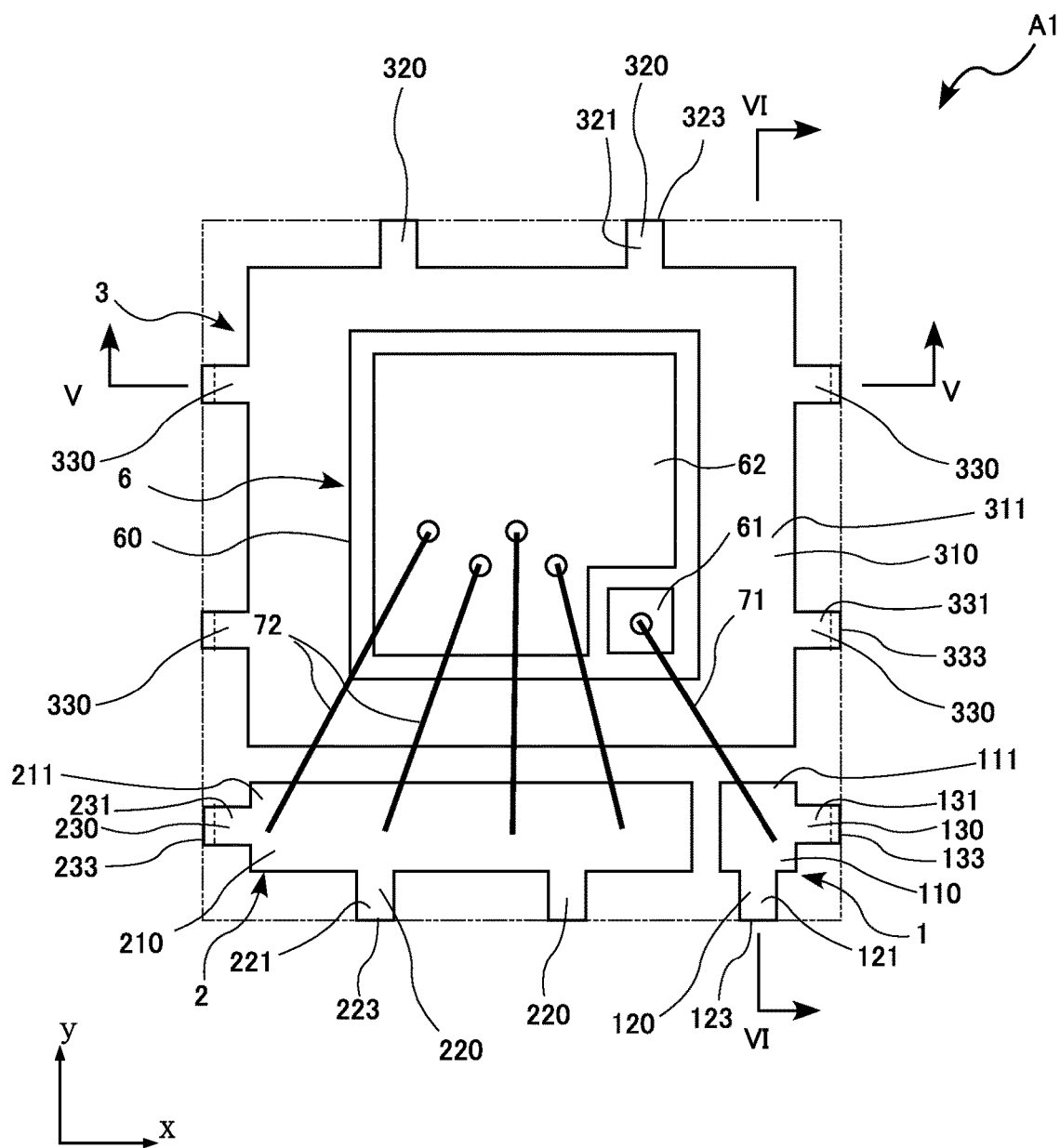
FIG. 3 is a plan view of the semiconductor device shown in FIG. 1.
Figure 4:
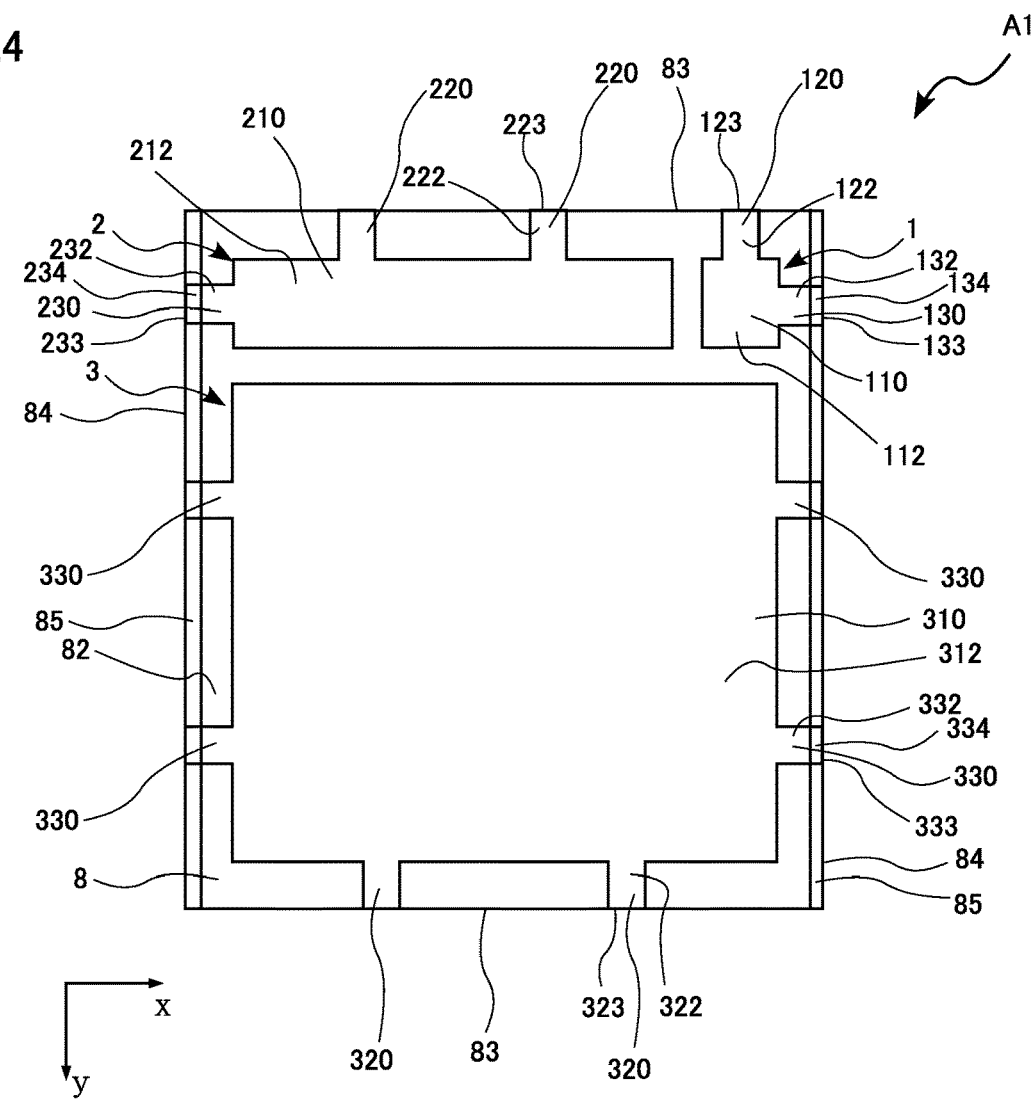
FIG. 4 is a bottom view of the semiconductor device shown in FIG. 1.
Figure 5:
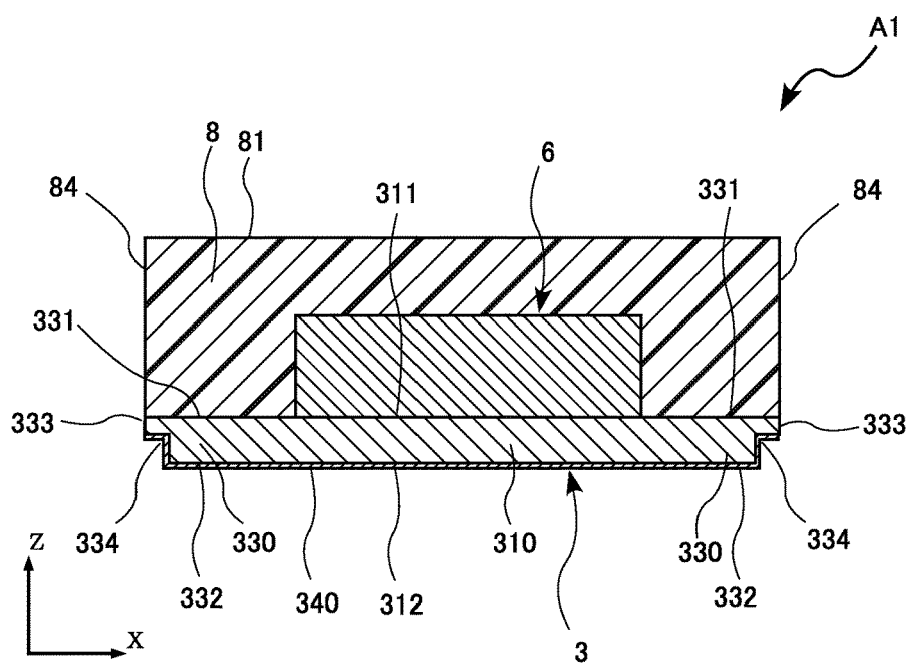
FIG. 5 is a cross-sectional view taken along a line V-V in FIG. 3.
Figure 6:
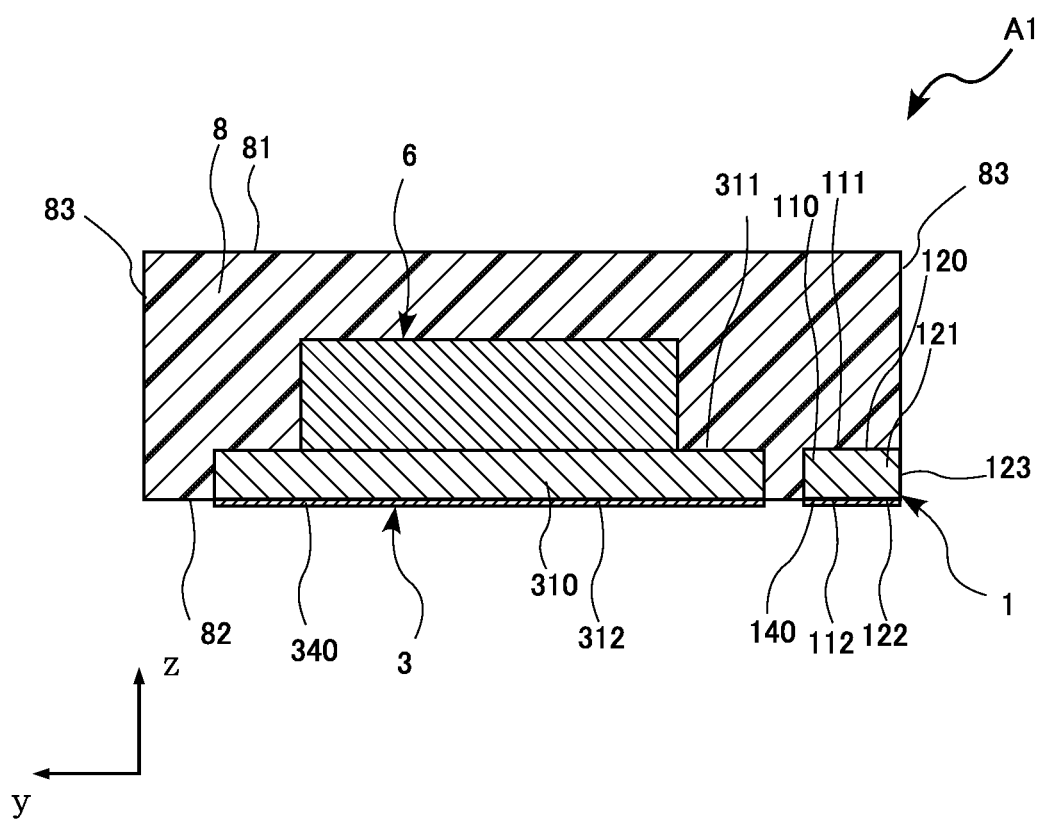
FIG. 6 is a cross-sectional view taken along a line VI-VI in FIG. 3.

FIG. 1 is a perspective view showing the semiconductor device A1. FIG. 2 is a perspective view showing the semiconductor device A1, with the bottom face oriented upward. FIG. 3 is a plan view of the semiconductor device A1. In FIG. 3, the sealing resin 8 is seen through, such that the outer shape of the sealing resin 8 is indicated by imaginary lines (dash-dot-dot lines), for the sake of clarity. FIG. 4 is a bottom view of the semiconductor device A1. FIG. 5 is a cross-sectional view taken along a line V-V in FIG. 3. FIG. 6 is a cross-sectional view taken along a line VI-VI in FIG. 3.

The semiconductor device A1 shown in the mentioned drawings is to be surface-mounted on a circuit board of various apparatuses. The semiconductor device A1 has a rectangular shape, as viewed in a thickness direction. For the sake of convenience of description, the thickness direction of the semiconductor device A1 will be defined as z-direction, a direction perpendicular to the z-direction and extending along one side of the semiconductor device A1 (right-left direction in FIG. 3) will be defined as x-direction, and a direction perpendicular to both of the z-direction and the x-direction (up-down direction in FIG. 3) will be defined as y-direction. The z-direction corresponds to "thickness direction" in the present disclosure, and the y-direction corresponds to "first direction" in the present disclosure. The size of the semiconductor device A1 is not specifically limited and, in this embodiment for example, approximately 4 to 5 mm in the x-direction, approximately 5 to 6 mm in the y-direction, and approximately 0.5 to 1 mm in the z-direction.

The plurality of leads (first to third leads) 1 to 3 serve to support the semiconductor element 6, and are electrically connected to the semiconductor element 6. The leads 1 to 3 are formed, for example, by subjecting a metal plate to a punching or etching process. The leads 1 to 3 are formed of a metal, preferably either Cu or Ni or an alloy thereof, or a 42 alloy. In this embodiment, it will be assumed that the leads 1 to 3 are formed of Cu. The leads 1 to 3 have a thickness of 0.08 to 0.3 mm for example and, in this embodiment, approximately 0.2 mm.

As shown in FIG. 3, the third lead 3 is located on an end portion of the semiconductor device A1 in the y-direction (upper end in FIG. 3), and extends all the way in the x-direction. The first lead 1 and the second lead 2 are located on the other end portion of the semiconductor device A1 in the y-direction (lower end in FIG. 3) with a spacing from the third lead 3, and are aligned in the x-direction with a spacing therebetween. The third lead 3 has the largest size and the first lead 1 has the smallest size, as viewed in the z-direction.

The third lead 3 includes a mounting base 310, first terminal sections 320, and second terminal sections 330.

The mounting base 310 is located in the central portion of the third lead 3 as viewed in the z-direction, and has a generally rectangular shape as viewed in the z-direction. The mounting base 310 includes a mounting base obverse face 311 and a mounting base reverse face 312. The mounting base obverse face 311 and the mounting base reverse face 312 are oriented in opposite directions to each other, in the z-direction. The mounting base obverse face 311 is oriented upward in FIG. 5 and FIG. 6. The semiconductor element 6 is mounted on the mounting base obverse face 311. The mounting base reverse face 312 is oriented downward in FIG. 5 and FIG. 6. The mounting base reverse face 312 is exposed from the sealing resin 8, to serve as a reverse face terminal. The shape of the mounting base 310 is not specifically limited. For example, a thinner portion may be formed around the mounting base 310 by half etching, to prevent the third lead 3 from coming off from the sealing resin 8.

The first terminal sections 320 are each connected to the mounting base 310, and have a generally rectangular shape as viewed in the z-direction. Two first terminal sections 320 are provided on an end face of the mounting base 310 in the y-direction (upper end face in FIG. 3). The first terminal sections 320 each include a first terminal section obverse face 321, a first terminal section reverse face 322, and a first terminal section end face 323. The first terminal section obverse face 321 and the first terminal section reverse face 322 are oriented in opposite directions to each other, in the z-direction. The first terminal section obverse face 321 is oriented upward in FIG. 5 and FIG. 6. The first terminal section obverse face 321 and the mounting base obverse face 311 are flush with each other. The first terminal section reverse face 322 is oriented downward in FIG. 5 and FIG. 6. The first terminal section reverse face 322 and the mounting base reverse face 312 are flush with each other. The first terminal section end face 323 is connected to the first terminal section obverse face 321 and the first terminal section reverse face 322, and oriented outward in the y-direction. The first terminal section end face 323 is formed by full-cut dicing in a second cutting process of the manufacturing process to be subsequently described. The first terminal section end face 323 and the first terminal section reverse face 322, connected to each other, are both exposed from the sealing resin 8, to serve as a terminal (see FIG. 4). Here, the shape, position, and the number of the first terminal sections 320 are not specifically limited.

The second terminal sections 330 are each connected to the mounting base 310, and have a generally rectangular shape as viewed in the z-direction. Two second terminal sections 330 are provided on the respective end faces of the mounting base 310 in the x-direction, namely four in total. The second terminal sections 330 each include a second terminal section obverse face 331, a second terminal section reverse face 332, a second terminal section end face 333, and a second terminal section recess 334. The second terminal section obverse face 331 and the second terminal section reverse face 332 are oriented in opposite directions to each other, in the z-direction. The second terminal section obverse face 331 is oriented upward in FIG. 5 and FIG. 6. The second terminal section obverse face 331 and the mounting base obverse face 311 are flush with each other. The second terminal section reverse face 332 is oriented downward in FIG. 5 and FIG. 6. The second terminal section reverse face 332 and the mounting base reverse face 312 are flush with each other. The second terminal section end face 333 is perpendicular to the second terminal section obverse face 331 and the second terminal section reverse face 332 and connected to the second terminal section obverse face 331, thus being oriented outward in the x-direction. The second terminal section end face 333 is formed by full-cut dicing in a first cutting process of the manufacturing process to be subsequently described. The second terminal section recess 334 is recessed from the second terminal section reverse face 332 toward the second terminal section obverse face 331, and formed along the outer edge of the second terminal section reverse face 332 in the x-direction, so as to extend to both ends in the y-direction. The second terminal section recess 334 is connected to the second terminal section reverse face 332 and the second terminal section end face 333. The second terminal section recess 334 is formed by half-cut dicing in a groove forming process of the manufacturing process to be subsequently described. The second terminal section end face 333, the second terminal section reverse face 332, and the second terminal section recess 334, which are connected to each other, are exposed from the sealing resin 8, to serve as a terminal (see FIG. 4 and FIG. 5). Here, the shape, position, and the number of the second terminal section 330 are not specifically limited.

On the surface of the third lead 3, a plating layer 340 is provided over the mounting base reverse face 312, the first terminal section reverse face 322, the second terminal section reverse face 332, and the second terminal section recess 334 (see FIG. 5 and FIG. 6). The plating layer 340 includes, for example, a Ni-plating layer, a Pd-plating layer, and a Au-plating layer superposed on each other. For example, the Ni-plating layer has a thickness of 0.5 µm to 2.0 µm, the Pd-plating layer has a thickness of 0.02 µm to 0.15 µm, and the Au-plating layer has a thickness of 0.003 µm to 0.015 µm. The structure of the plating layer 340 is not specifically limited and, for example, the Ni-plating layer and the Au-plating layer may be superposed on each other. As will be subsequently described, a plating layer is formed over the entire portion of the lead frame exposed from the sealing resin through the manufacturing process. However, since the first terminal section end face 323 and the second terminal section end face 333 correspond to the cut section formed through the first cutting process or the second cutting process, the plating layer 340 is not formed on these end faces.

Although the second terminal section end face 333 is without the plating layer 340, the second terminal section recess 334 is covered with the plating layer 340. Accordingly, when the semiconductor device A1 is mounted on a circuit board, a solder fillet is formed on the portion of the plating layer 340 corresponding to the second terminal section recess 334. Therefore, the mounting strength of the semiconductor device A1 onto the circuit board can be enhanced. In addition, the bonding status between the third lead 3 and the circuit board after the mounting can be easily examined by an appearance check.

The first lead 1 is located at a corner portion of the semiconductor device A1 (lower right corner in FIG. 3), as viewed in the z-direction, and includes a wire bonding region 110, a first terminal section 120, and a second terminal section 130.

The wire bonding region 110 has a rectangular shape as viewed in the z-direction, and is located in a region of the first lead 1 on the side of the third lead 3. The wire bonding region 110 includes a wire bonding region obverse face 111 and a wire bonding region reverse face 112. The wire bonding region obverse face 111 and the wire bonding region reverse face 112 are oriented in opposite directions to each other, in the z-direction. The wire bonding region obverse face 111 is oriented upward in FIG. 5 and FIG. 6.

The wire bonding region obverse face 111 is where the bonding wire 71 is to be bonded. The wire bonding region reverse face 112 is oriented downward in FIG. 5 and FIG. 6. The wire bonding region reverse face 112 is exposed from the sealing resin 8, to serve as a reverse face terminal. The shape of the wire bonding region 110 is not specifically limited. For example, a thinner portion may be formed around the wire bonding region 110 by half etching, to prevent the first lead 1 from coming off from the sealing resin 8.

The first terminal section 120 is connected to the wire bonding region 110, and has a generally rectangular shape as viewed in the z-direction. A single first terminal section 120 is located on the opposite side of the third lead 3 across the wire bonding region 110, and at an end face in the y-direction (lower end face in FIG. 3). The first terminal section 120 includes a first terminal section obverse face 121, a first terminal section reverse face 122, and a first terminal section end face 123. The first terminal section obverse face 121 and the first terminal section reverse face 122 are oriented in opposite directions to each other, in the z-direction. The first terminal section obverse face 121 is oriented upward in FIG. 5 and FIG. 6. The first terminal section obverse face 121 and the wire bonding region obverse face 111 are flush with each other. The first terminal section reverse face 122 is oriented downward in FIG. 5 and FIG. 6. The first terminal section reverse face 122 and the wire bonding region reverse face 112 are flush with each other. The first terminal section end face 123 is connected to the first terminal section obverse face 121 and the first terminal section reverse face 122, and is oriented outward in the y-direction. The first terminal section end face 123 is formed by full-cut dicing in the second cutting process of the manufacturing process to be subsequently described. The first terminal section end face 123 and the first terminal section reverse face 122, connected to each other, are exposed from the sealing resin 8, to serve as a terminal (see FIG. 4). The shape, position, and the number of the first terminal section 120 are not specifically limited.

The second terminal section 130 is connected to the wire bonding region 110, and has a generally rectangular shape as viewed in the z-direction. A single second terminal section 130 is located on an end face of the wire bonding region 110 in the x-direction (right end face in FIG. 3). The second terminal section 130 includes a second terminal section obverse face 131, a second terminal section reverse face 132, a second terminal section end face 133, and a second terminal section recess 134. The second terminal section obverse face 131 and the second terminal section reverse face 132 are oriented in opposite directions to each other, in the z-direction. The second terminal section obverse face 131 is oriented upward in FIG. 5 and FIG. 6. The second terminal section obverse face 131 and the wire bonding region obverse face 111 are flush with each other. The second terminal section reverse face 132 is oriented downward in FIG. 5 and FIG. 6. The second terminal section reverse face 132 and the wire bonding region reverse face 112 are flush with each other. The second terminal section end face 133 is perpendicular to the second terminal section obverse face 131 and the second terminal section reverse face 132 and connected to the second terminal section obverse face 131, thus being oriented outward in the x-direction. The second terminal section end face 133 is formed by full-cut dicing in the first cutting process of the manufacturing process to be subsequently described. The second terminal section recess 134 is recessed from the second terminal section reverse face 132 toward the second terminal section obverse face 131, and formed along the outer edge of the second terminal section reverse face 132 in the x-direction, so as to extend to both ends in the y-direction. The second terminal section recess 134 is connected to the second terminal section reverse face 132 and the second terminal section end face 133. The second terminal section recess 134 is formed by half-cut dicing in the groove forming process of the manufacturing process to be subsequently described. The second terminal section end face 133, the second terminal section reverse face 132, and the second terminal section recess 134, connected to each other, are exposed from the sealing resin 8, to serve as a terminal (see FIG. 4).

On the surface of the first lead 1, a plating layer 140 is provided over the wire bonding region reverse face 112, the first terminal section reverse face 122, the second terminal section reverse face 132, and the second terminal section recess 134 (see FIG. 6). The plating layer 140 includes, like the plating layer 340 of the lead 3, a Ni-plating layer, a Pd-plating layer, and a Au-plating layer superposed on each other. The structure of the plating layer 140 is not specifically limited. As will be subsequently described, a plating layer is formed over the entire portion of the lead frame exposed from the sealing resin through the manufacturing process. However, since the first terminal section end face 123 and the second terminal section end face 133 correspond to the cut section formed through the first cutting process or the second cutting process, the plating layer 140 is not formed on these end faces.

Although the second terminal section end face 133 is without the plating layer 140, the second terminal section recess 134 is covered with the plating layer 140. Accordingly, when the semiconductor device A1 is mounted on a circuit board, a solder fillet is formed on the portion of the plating layer 140 corresponding to the second terminal section recess 134. Therefore, the mounting strength of the semiconductor device A1 onto the circuit board can be enhanced. In addition, the bonding status between the first lead 1 and the circuit board after the mounting can be easily examined by an appearance check.

The second lead 2 is located at a corner portion of the semiconductor device A1 (lower left corner in FIG. 3), as viewed in the z-direction, and includes a wire bonding region 210, a first terminal section 220, and a second terminal section 230.

The wire bonding region 210 has a rectangular shape having the long sides extending in the x-direction, as viewed in the z-direction, and is located in a region of the second lead 2 on the side of the third lead 3. The wire bonding region 210 includes a wire bonding region obverse face 211 and a wire bonding region reverse face 212. The wire bonding region obverse face 211 and the wire bonding region reverse face 212 are oriented in opposite directions to each other, in the z-direction. The wire bonding region obverse face 211 is oriented upward in FIG. 5 and FIG. 6. The wire bonding region obverse face 211 is where the bonding wire 72 is to be bonded. The wire bonding region reverse face 212 is oriented downward in FIG. 5 and FIG. 6. The wire bonding region reverse face 212 is exposed from the sealing resin 8, to serve as a reverse face terminal. The shape of the wire bonding region 210 is not specifically limited. For example, a thinner portion may be formed around the wire bonding region 210 by half etching, to prevent the second lead 2 from coming off from the sealing resin 8.

The first terminal section 220 is connected to the wire bonding region 210, and has a generally rectangular shape as viewed in the z-direction. Two such first terminal sections 220 are located on the opposite side of the third lead 3 across the wire bonding region 210, along an end face (lower end face in FIG. 3) in the y-direction. The first terminal sections 220 each include a first terminal section obverse face 221, a first terminal section reverse face 222, and a first terminal section end face 223. The first terminal section obverse face 221 and the first terminal section reverse face 222 are oriented in opposite directions to each other, in the z-direction. The first terminal section obverse face 221 is oriented upward in FIG. 5 and FIG. 6. The first terminal section obverse face 221 and the wire bonding region obverse face 211 are flush with each other. The first terminal section reverse face 222 is oriented downward in FIG. 5 and FIG. 6. The first terminal section reverse face 222 and the wire bonding region reverse face 212 are flush with each other. The first terminal section end face 223 is connected to the first terminal section obverse face 221 and the first terminal section reverse face 222, and oriented outward in the y-direction. The first terminal section end face 223 is formed by full-cut dicing in the second cutting process of the manufacturing process to be subsequently described. The first terminal section end face 223 and the first terminal section reverse face 222, connected to each other, are exposed from the sealing resin 8, to serve as a terminal (see FIG. 4). The shape, position, and the number of the first terminal section 220 are not specifically limited.

The second terminal section 230 is connected to the wire bonding region 210, and has a generally rectangular shape as viewed in the z-direction. A single second terminal section 230 is located at an end face of the wire bonding region 210 (left end face in FIG. 3), in the x-direction. The second terminal section 230 includes a second terminal section obverse face 231, a second terminal section reverse face 232, a second terminal section end face 233, and a second terminal section recess 234. The second terminal section obverse face 231 and the second terminal section reverse face 232 are oriented in opposite directions to each other, in the z-direction. The second terminal section obverse face 231 is oriented upward in FIG. 5 and FIG. 6. The second terminal section obverse face 231 and the wire bonding region obverse face 211 are flush with each other. The second terminal section reverse face 232 is oriented downward in FIG. 5 and FIG. 6. The second terminal section reverse face 232 and the wire bonding region reverse face 212 are flush with each other. The second terminal section end face 233 is perpendicular to the second terminal section obverse face 231 and the second terminal section reverse face 232, and connected to the second terminal section obverse face 231, thus being oriented outward in the x-direction. The second terminal section end face 233 is formed by full-cut dicing in the first cutting process of the manufacturing process to be subsequently described. The second terminal section recess 234 is recessed from the second terminal section reverse face 232 toward the second terminal section obverse face 231, and formed along the outer edge of the second terminal section reverse face 232 in the x-direction, so as to extend to both ends in the y-direction. The second terminal section recess 234 is connected to the second terminal section reverse face 232 and the second terminal section end face 233. The second terminal section recess 234 is formed by half-cut dicing in the groove forming process of the manufacturing process to be subsequently described. The second terminal section end face 233, the second terminal section reverse face 232, and the second terminal section recess 234, connected to each other, are exposed from the sealing resin 8, to serve as a terminal (see FIG. 4).

On the surface of the second lead 2, a non-illustrated plating layer is provided over the wire bonding region reverse face 212, the first terminal section reverse face 222, the second terminal section reverse face 232, and the second terminal section recess 234. The plating layer includes, like the plating layer 340 of the third lead 3, a Ni-plating layer, a Pd-plating layer, and a Au-plating layer superposed on each other. The structure of the plating layer is not specifically limited. As will be subsequently described, a plating layer is formed over the entire portion of the lead frame exposed from the sealing resin through the manufacturing process. However, since the first terminal section end face 223 and the second terminal section end face 233 correspond to the cut section formed through the first cutting process or the second cutting process, the plating layer is not formed on these end faces.

Although the second terminal section end face 233 is without the plating layer, the second terminal section recess 234 is covered with the plating layer. Accordingly, when the semiconductor device A1 is mounted on a circuit board, a solder fillet is formed on the portion of the plating layer corresponding to the second terminal section recess 234. Therefore, the mounting strength of the semiconductor device A1 onto the circuit board can be enhanced. In addition, the bonding status between the second lead 2 and the circuit board after the mounting can be easily examined by an appearance check.

The semiconductor element 6 serves to perform the electrical functions of the semiconductor device A1. The type of the semiconductor element 6 is not specifically limited. In this embodiment, the semiconductor element 6 is a transistor such as a metal-oxide-semiconductor field-effect transistor (MOSFET). The semiconductor element 6 includes an element main body 60, a first electrode 61, a second electrode 62, and a third electrode 63.

The first electrode 61 and the second electrode 62 are provided on a face of the element main body 60 on the opposite side of the third lead 3. The third electrode 63 is provided on a face of the element main body 60 opposed to the third lead 3. In this embodiment, the first electrode 61 is a gate electrode, the second electrode 62 is a source electrode, and the third electrode 63 is a drain electrode.

The semiconductor element 6 is mounted on the central portion of the mounting base obverse face 311 of the third lead 3, via a conductive bonding material. Accordingly, the third electrode 63 of the semiconductor element 6 is electrically connected to the third lead 3, via the conductive bonding material. The bonding wire 71 is connected to the first electrode 61 of the semiconductor element 6 and the wire bonding region obverse face 111 of the first lead 1. Accordingly, the first electrode 61 of the semiconductor element 6 is electrically connected to the first lead 1. The plurality of bonding wires 72 are connected to the second electrode 62 of the semiconductor element 6 and the wire bonding region obverse face 211 of the second lead 2. Accordingly, the second electrode 62 of the semiconductor element 6 is electrically connected to the second lead 2.

The aforementioned configuration of the semiconductor element 6 and the connection method to the leads 1 to 3 are merely exemplary. The type, the number, and the location of the semiconductor element 6 are not limited, and the connection method is not limited either.

The sealing resin 8 covers a part of each of the leads 1 to 3, the semiconductor element 6, and the bonding wires 71 and 72. The sealing resin 8 is, for example, formed of a black epoxy resin.

The sealing resin 8 includes a resin obverse face 81, a resin reverse face 82, a resin first side face 83, a resin second side face 84, and a resin recess 85. The resin obverse face 81 and the resin reverse face 82 are oriented in opposite directions to each other, in the z-direction. The resin obverse face 81 is oriented upward in FIG. 5 and FIG. 6, and the resin reverse face 82 is oriented downward in FIG. 5 and FIG. 6. The resin first side face 83 is connected to the resin obverse face 81 and the resin reverse face 82, and oriented outward in the y-direction. The resin first side face 83 is formed by full-cut dicing in the second cutting process of the manufacturing process to be subsequently described. The resin second side face 84 is perpendicular to the resin obverse face 81 and the resin reverse face 82, and connected to the resin obverse face 81, thus being oriented outward in the x-direction. The resin second side face 84 is formed by full-cut dicing in the first cutting process of the manufacturing process to be subsequently described. The resin recess 85 is recessed from the resin reverse face 82 toward the resin obverse face 81, and formed along each of outer edges of the resin reverse face 82 in the x-direction, so as to extend all the way to both ends in the y-direction. The resin recess 85 is connected to the resin reverse face 82 and the resin second side face 84. The resin recess 85 is formed by half-cut dicing in the groove forming process of the manufacturing process to be subsequently described.

The first terminal section end face 123 of the first lead 1 and the first terminal section end face 223 of the second lead 2 are flush with the resin first side face 83 on one side, and the first terminal section end faces 323 of the third lead 3 are flush with the resin first side face 83 on the other side. The second terminal section end faces 333 on one side of the third lead 3 (right side in FIG. 3) in the x-direction, and the second terminal section end face 133 of the first lead 1 are flush with the resin second side face 84 on one side (right side in FIG. 3). In addition, the second terminal section end faces 333 on the other side of the third lead 3 (left side in FIG. 3) in the x-direction, and the second terminal section end face 233 of the second lead 2 are flush with the resin second side face 84 on the other side (left side in FIG. 3).

Referring now to FIG. 7 to FIG. 16, an example of methods for manufacturing the semiconductor device A1 will be described below.

Figure 7:
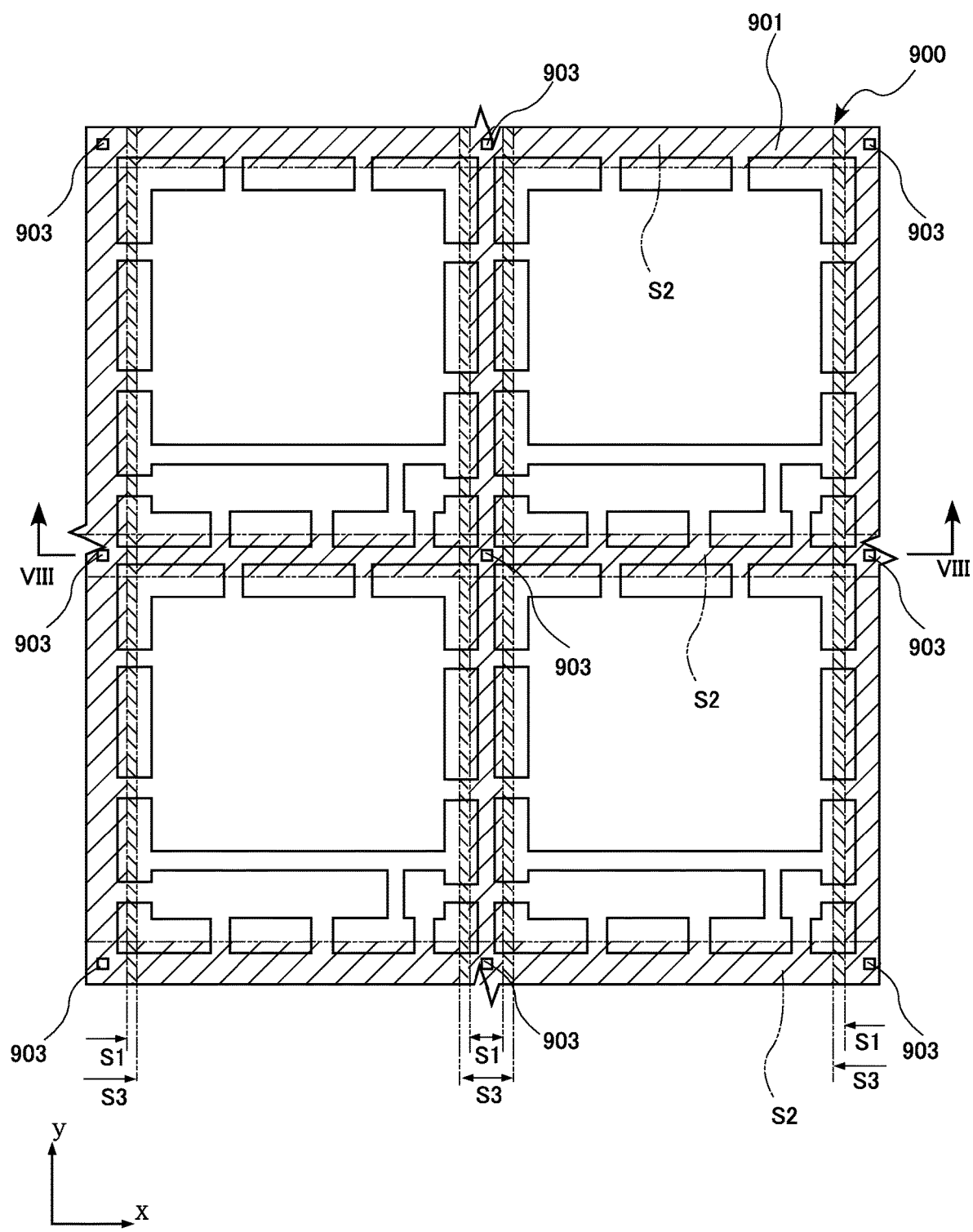
FIG. 7 is a plan view for explaining a manufacturing process of the semiconductor device shown in FIG. 1.
Figure 8:
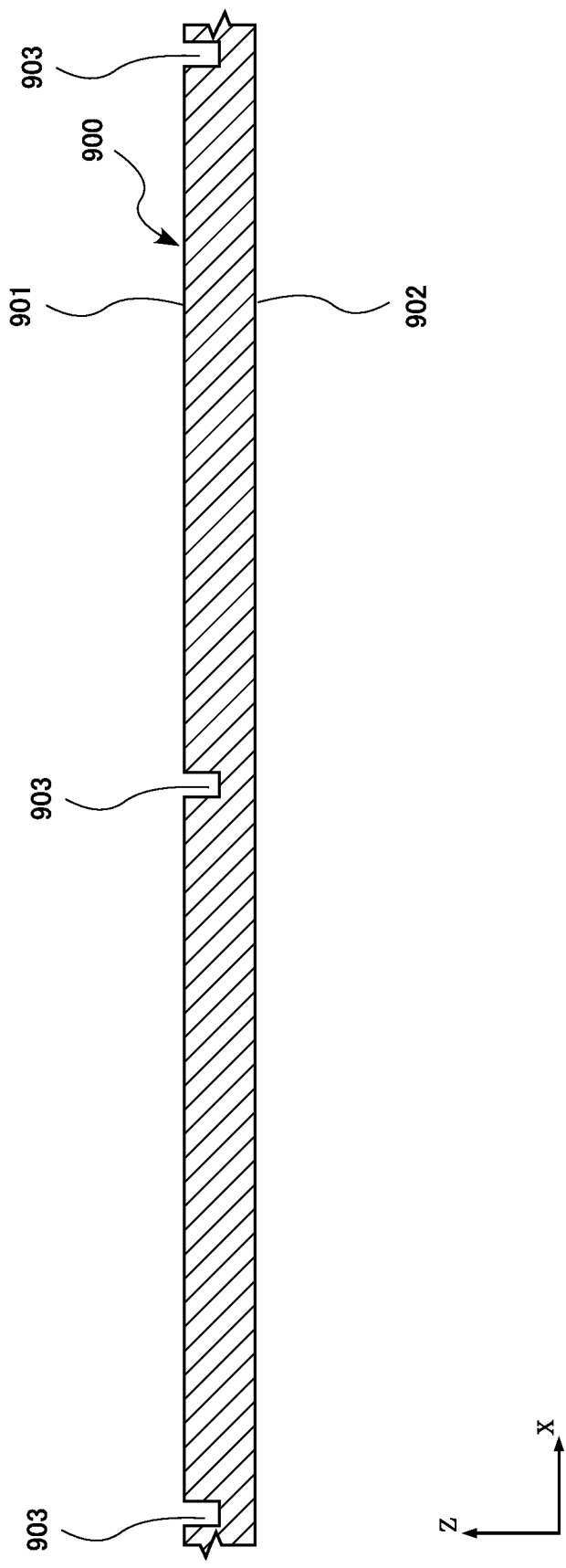
FIG. 8 is a cross-sectional view taken along a line VIII-VIII in FIG. 7.

First, a lead frame 900 is prepared as shown in FIG. 7 and FIG. 8. The lead frame 900 is a plate-shaped material to be formed into the leads 1 to 3. In this embodiment, the lead frame 900 is formed of Cu, through an etching process. The lead frame 900 may be formed through a different process, such as punching a metal plate. The lead frame 900 includes an obverse face 901 and a reverse face 902. The obverse face 901 and the reverse face 902 are spaced apart from each other in the z-direction. The obverse face 901 is oriented upward in FIG. 8, and to be formed into the wire bonding region obverse face 111, the first terminal section obverse face 121, and the second terminal section obverse face 131 of the first lead 1, the wire bonding region obverse face 211, the first terminal section obverse face 221, and the second terminal section obverse face 231 of the second lead 2, and the mounting base obverse face 311, the first terminal section obverse face 321, and the second terminal section obverse face 331 of the third lead 3. The reverse face 902 is oriented downward in FIG. 8, and to be formed into the wire bonding region reverse face 112, the first terminal section reverse face 122, and the second terminal section reverse face 132 of the first lead 1, the wire bonding region reverse face 212, the first terminal section reverse face 222, and the second terminal section reverse face 232 of the second lead 2, and the mounting base reverse face 312, the first terminal section reverse face 322, and the second terminal section reverse face 332 of the third lead 3. As shown in FIG. 8, the reverse face 902 is flat over its entirety.

As shown in FIG. 7, three kinds of regions S1 to S3 are defined on the lead frame 900. First disposal regions S1 are each relatively sparsely hatched and extend to be elongated in the y-direction. The first disposal regions S1 are to be removed through the first cutting process to be subsequently described. The first disposal regions S1 each extend in the y-direction between portions of the lead frame 900 adjacent to each other in the x-direction (portions to be formed into the third lead 3). Second disposal regions S2 are relatively sparsely hatched like the first disposal region S1 and each extend to be elongated in the x-direction. The second disposal regions S2 are to be removed through the second cutting process to be subsequently described. The second disposal regions S2 each extend in the x-direction between portions of the lead frame 900 adjacent to each other in the y-direction (portions where the semiconductor device A1 is to be formed). Groove forming regions S3 each include a corresponding one of the first disposal region S1 and regions (relatively densely hatched) located on the respective sides of the region S1. The groove forming regions S3 are where the groove is to be formed on the reverse face 902, through the groove forming process to be subsequently described, and each extend in the y-direction between portions of the lead frame 900 adjacent to each other in the x-direction (portions to be formed into the third lead 3). The groove forming region S3 is wider in the x-direction than the first disposal region S1, and includes the first disposal region S1 along the central portion in the x-direction. In other words, the first disposal region S1 is narrower than the groove forming region S3, and arranged so that the entirety of the region S1 overlaps with the groove forming region S3.

In this embodiment, the lead frame 900 includes a plurality of recesses 903. The recesses 903 are provided as a mark to be utilized in the first cutting process, and located along the first disposal region S1, at the center thereof in the x-direction. Each recess 903 has a rectangular shape as viewed in the z-direction, and is recessed from the obverse face 901 toward the reverse face 902 (see FIG. 8). The recess 903 has an open end on the side of the obverse face 901. In this embodiment, the recess 903 is formed through a half etching process performed from the side of the obverse face 901. The depth (size in the z-direction) of the recess 903 is, for example, half a thickness of the lead frame 900. The forming method of the recess 903 is not limited. The recess 903 may be formed, for example, by stamping. As shown in FIG. 7, the recess 903 is located in the region where the first disposal region S1 and the second disposal region S2 intersect. The position, number, and shape of the recesses 903 are not limited to those of the illustrated example.

Figure 9:
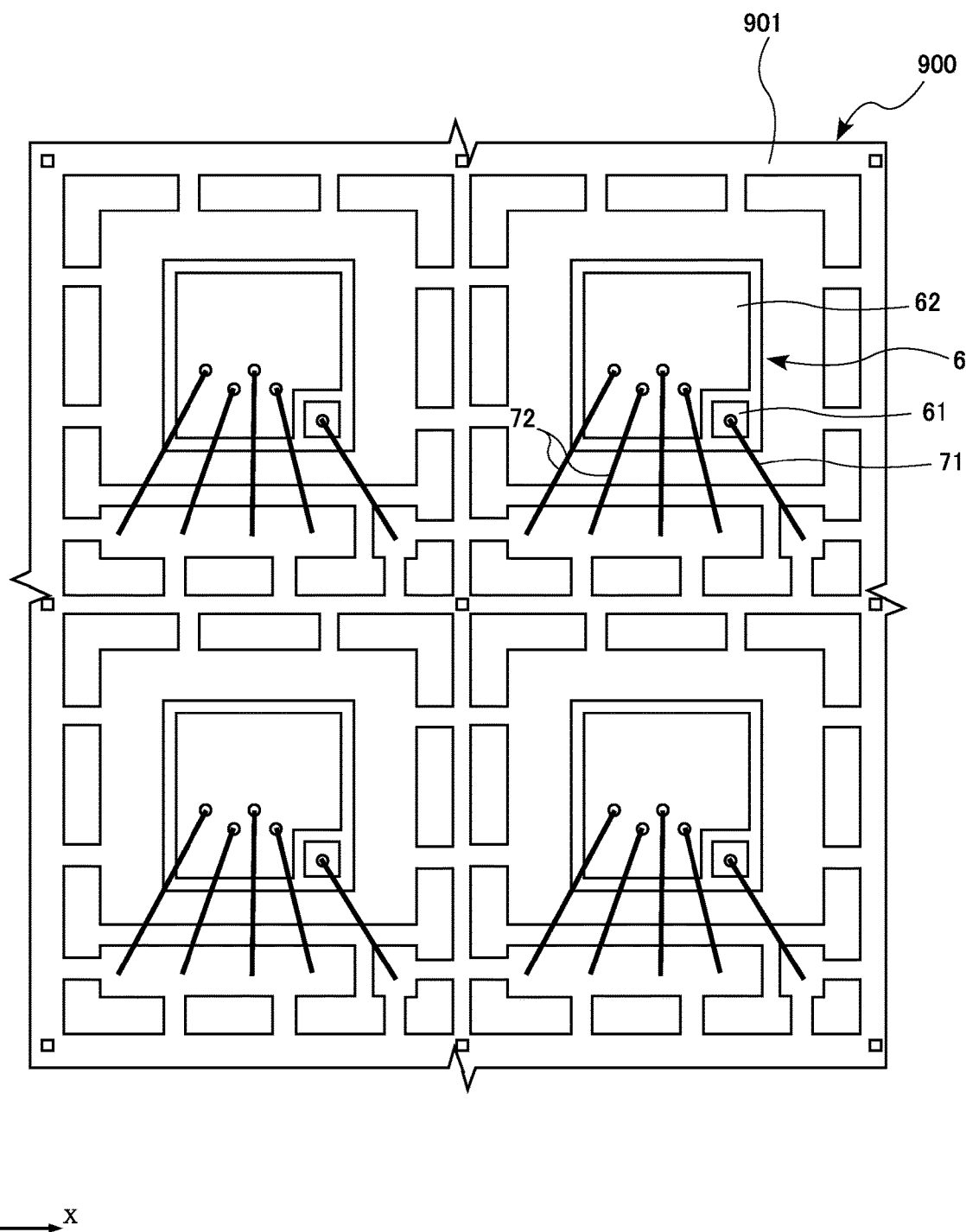
FIG. 9 is a plan view for explaining the manufacturing process of the semiconductor device shown in FIG. 1.

Proceeding to FIG. 9, the semiconductor element 6 is mounted on the lead frame 900 (mounting process). In the mounting process, first the semiconductor element 6 is bonded, via a conductive bonding material, to a region of the obverse face 901 of the lead frame 900 to be formed into the mounting base obverse face 311 of the lead 3. Then the bonding wire 71 is bonded to the position corresponding to the first electrode 61 of the semiconductor element 6 and the wire bonding region obverse face 111 of the first lead 1, and the plurality of bonding wires 72 are bonded to the position corresponding to the second electrode 62 of the semiconductor element 6 and the wire bonding region obverse face 211 of the second lead 2.

Figure 10:
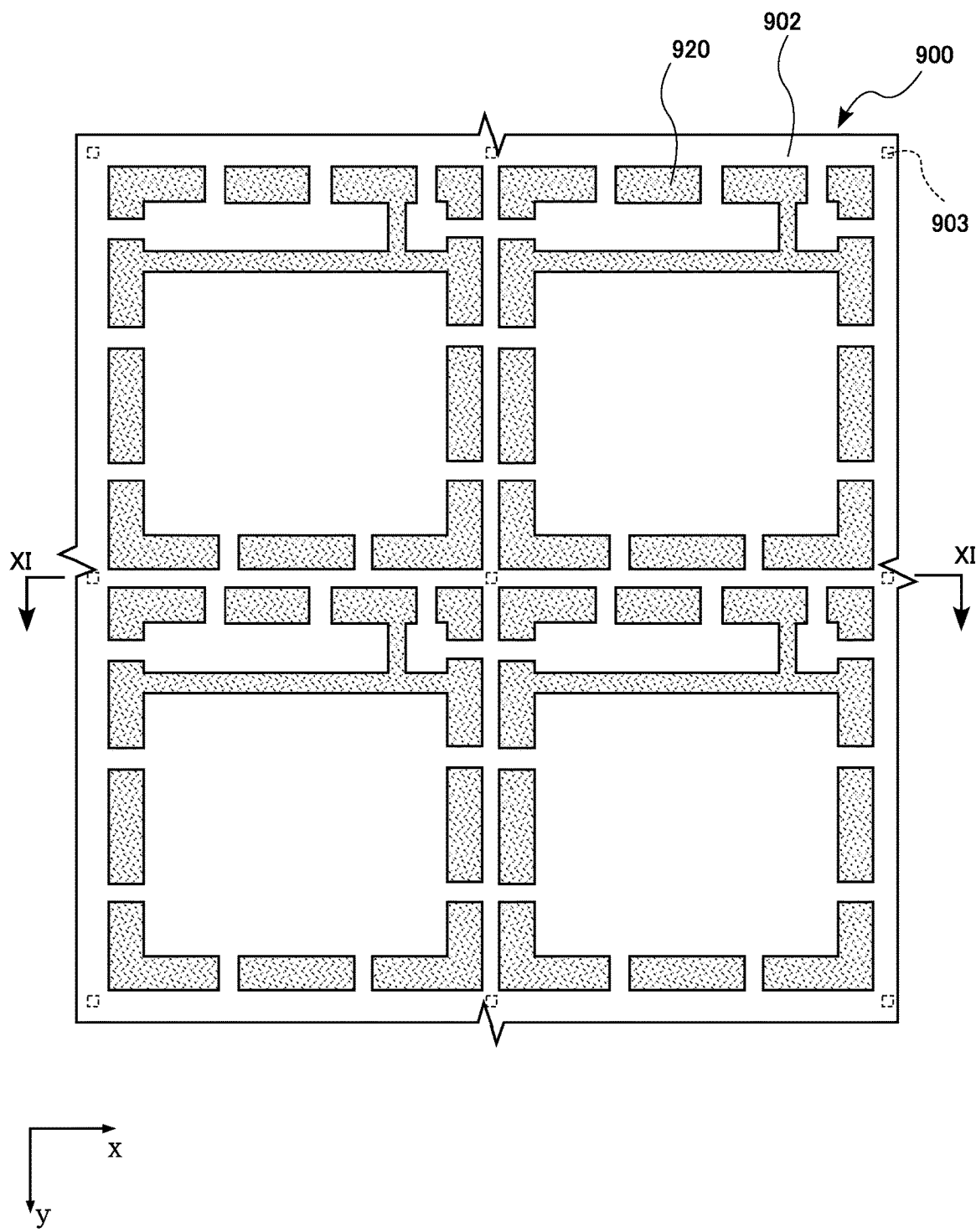
FIG. 10 is a bottom view for explaining the manufacturing process of the semiconductor device shown in FIG. 1.
Figure 11:
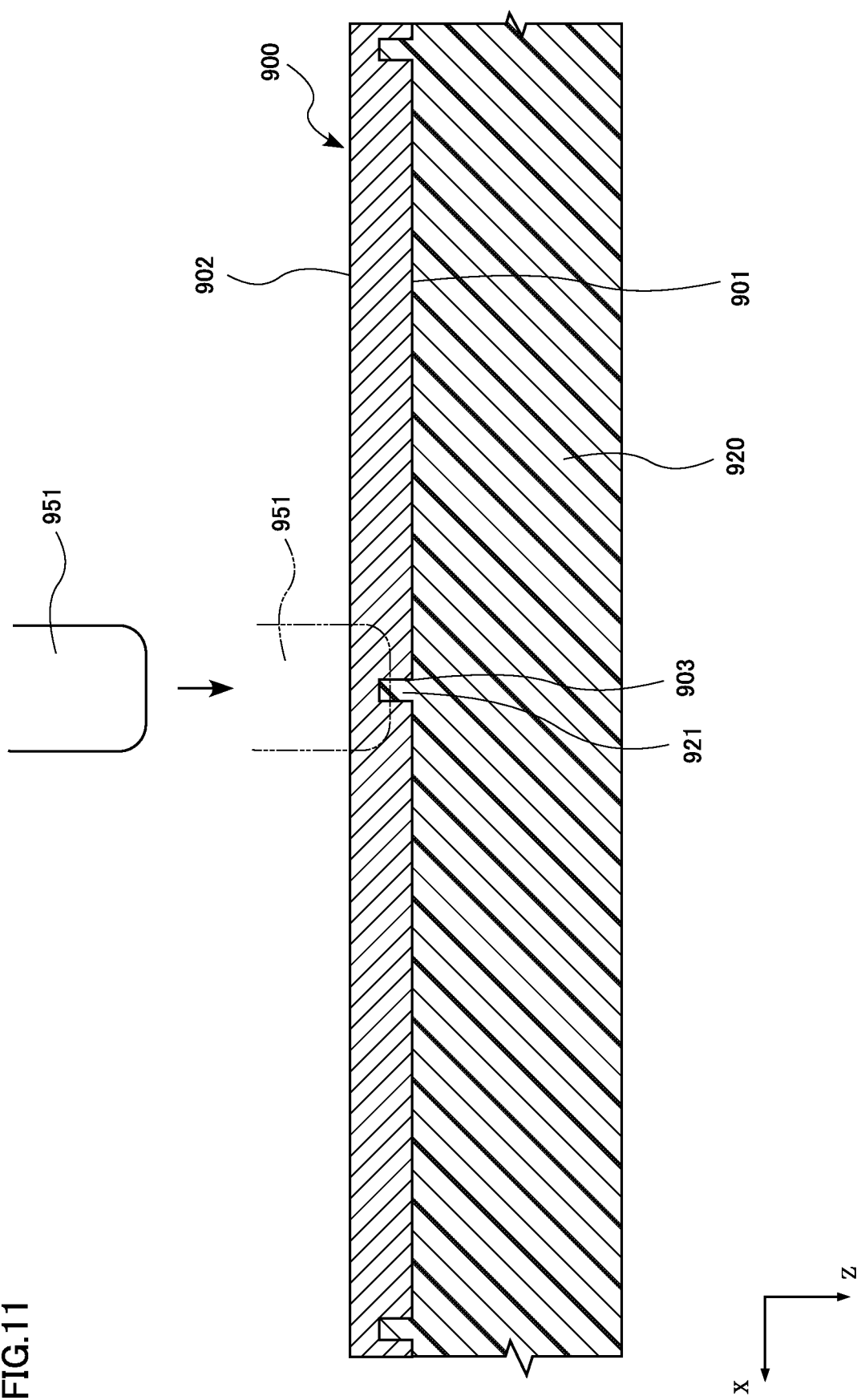
FIG. 11 is a cross-sectional view taken along a line XI-XI in FIG. 10.

Then as shown in FIG. 10 and FIG. 11, a sealing resin 920 is formed by curing a resin material, so as to cover a part of the lead frame 900, the semiconductor element 6, and the bonding wires 71 and 72 (resin forming process). In this embodiment, the sealing resin 920 is formed of a black epoxy resin. In FIG. 10, the sealing resin 920 is dotted. In the resin forming process, the fluidified resin material is injected into the mold, with the reverse face 902 of the lead frame 900 being made to contact the mold, and therefore the reverse face 902 of the lead frame 900 is exposed from the sealing resin 920 as shown in FIG. 10, and the reverse face 902 of the lead frame 900 and the reverse face of the sealing resin 920 (the face oriented to the same side as the reverse face 902) become flush with each other. The resin material is also filled in the recess 903 as shown in FIG. 11, and therefore the sealing resin 920 includes a filled portion 921 formed inside each of the recesses 903.

Figure 12:
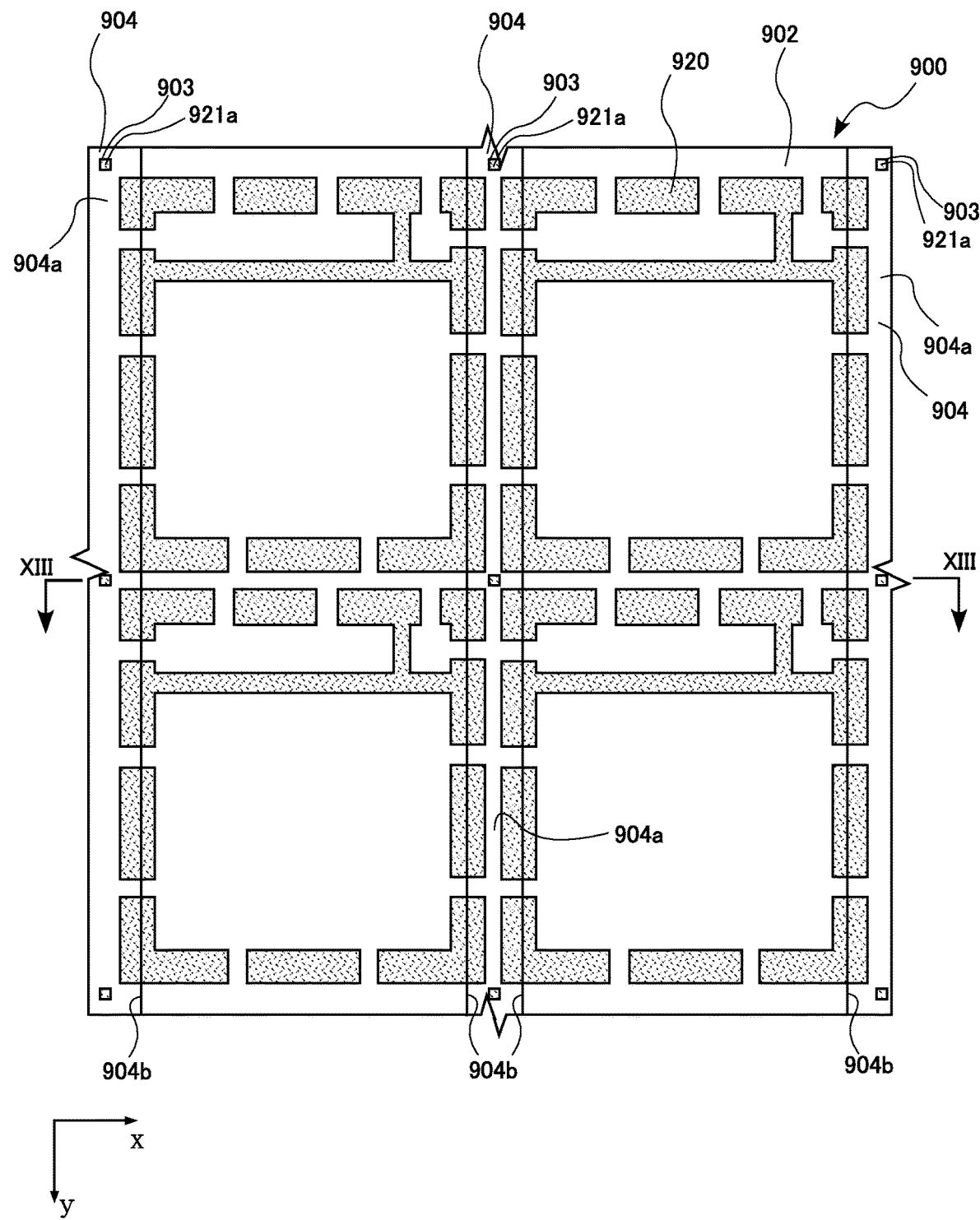
FIG. 12 is a bottom view for explaining the manufacturing process of the semiconductor device shown in FIG. 1.
Figure 13:
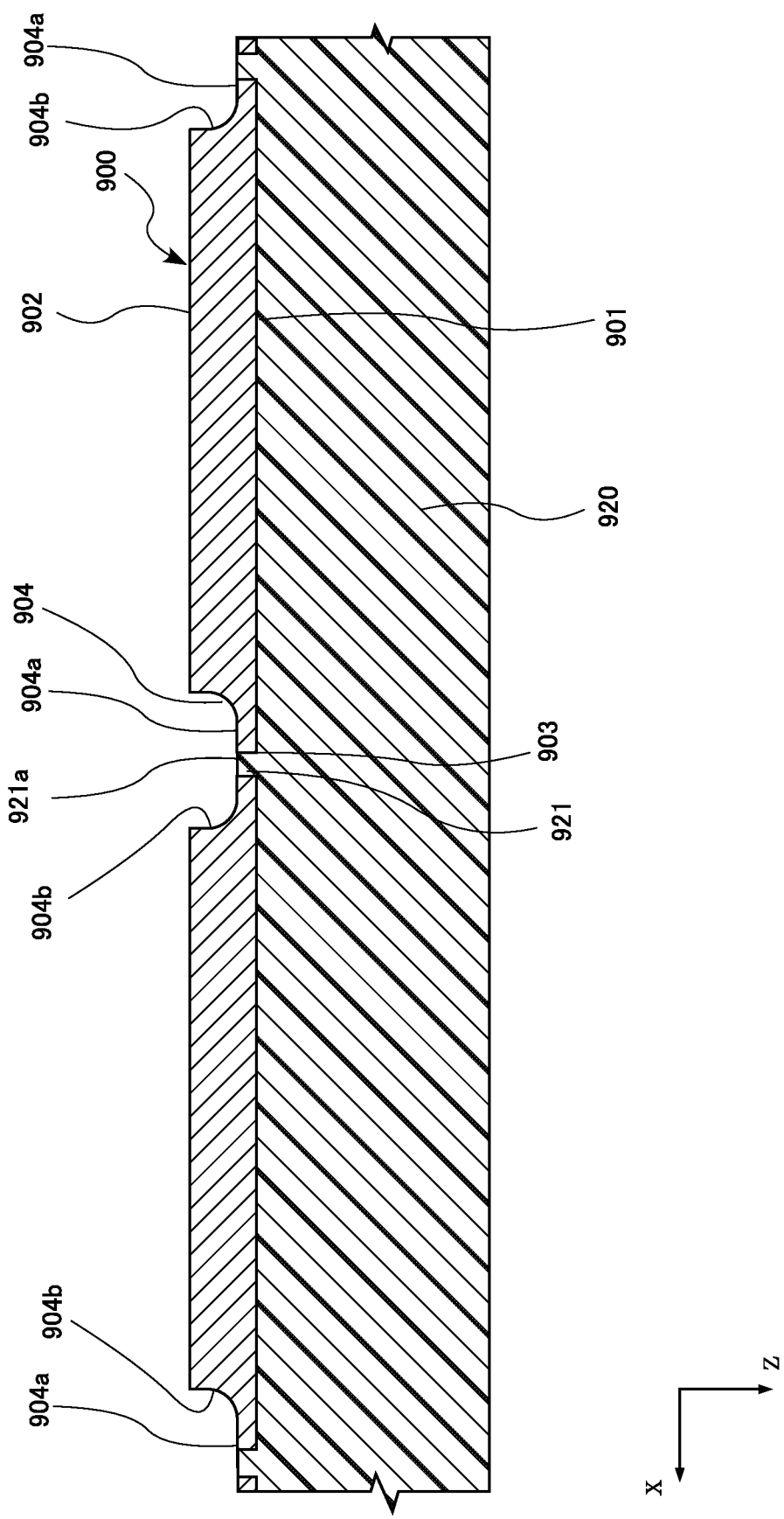
FIG. 13 is a cross-sectional view taken along a line XIII-XIII in FIG. 12.

Proceeding to FIG. 12 and FIG. 13, grooves 904 are formed (groove forming process). The grooves 904 are each formed so as to recede from the reverse face 902 of the lead frame 900 toward the obverse face 901 and to extend in the y-direction, at the position corresponding to the groove forming region S3. As shown in FIG. 12, the groove 904 is formed so as to stride over the lead frame 900 and the sealing resin 920. The groove 904 includes a bottom face 904a and side faces 904b. The bottom face 904a is oriented to the same side as the reverse face 902 of the lead frame 900. The side face 904b is connected to the reverse face 902 of the lead frame 900 (and also a face of the sealing resin 920 oriented to the same side as the reverse face 902), and the bottom face 904a. The groove 904 formed in the region of the lead frame 900 to be formed into the second terminal section 130 of the first lead 1 becomes the second terminal section recess 134, the groove 904 formed in the region to be formed into the second terminal section 230 of the second lead 2 becomes the second terminal section recess 234, and the groove 904 formed in the region to be formed into the second terminal section 330 of the third lead 3 becomes the second terminal section recess 334. Further, a part of the groove 904 formed in the sealing resin 920 becomes the resin recess 85.

As shown in FIG. 11, the groove forming process according to this embodiment includes the half-cut dicing process that uses a first blade 951 to remove (cut away) a part of the lead frame 900 from the side of the reverse face 902. The thickness (size in the x-direction) of the first blade 951 is determined according to the size of the groove forming region S3 in the x-direction. In this half-cut dicing process, the portion corresponding to the groove forming region S3 shown in FIG. 7 is cut from the side of the reverse face 902, with reference to alignment marks formed at predetermined positions on the lead frame 900 (e.g., four corners of the lead frame 900). In the half-cut dicing process, in addition, the cutting is performed to a position halfway of the lead frame 900 in the z-direction, and until reaching and exposing the recess 903 (until reaching the filled portion 921 of the sealing resin 920, as indicated by dash-dot-dot lines representing the first blade 951 in FIG. 11). In this embodiment, the cutting is performed to a depth exceeding half a thickness (size in the z-direction) of the lead frame 900, for example approximately two thirds of the thickness of the lead frame 900. Accordingly, as shown in FIG. 12 and FIG. 13, the bottom face 904a of the groove 904 is connected to the recess 903, so that the recess 903 is exposed from the bottom face 904*a*. Further, an end face 921*a* is formed on the filled portion 921 of the sealing resin 920, and exposed from the bottom face 904*a* of the groove 904. Since the sealing resin 920 is formed of a black epoxy resin in this embodiment, the end face 921*a* appears in the bottom face 904*a* of the groove 904, as a mark easy to be visually recognized. Here, other methods than the half-cut dicing may be adopted, to form the groove 904.

Figure 14:
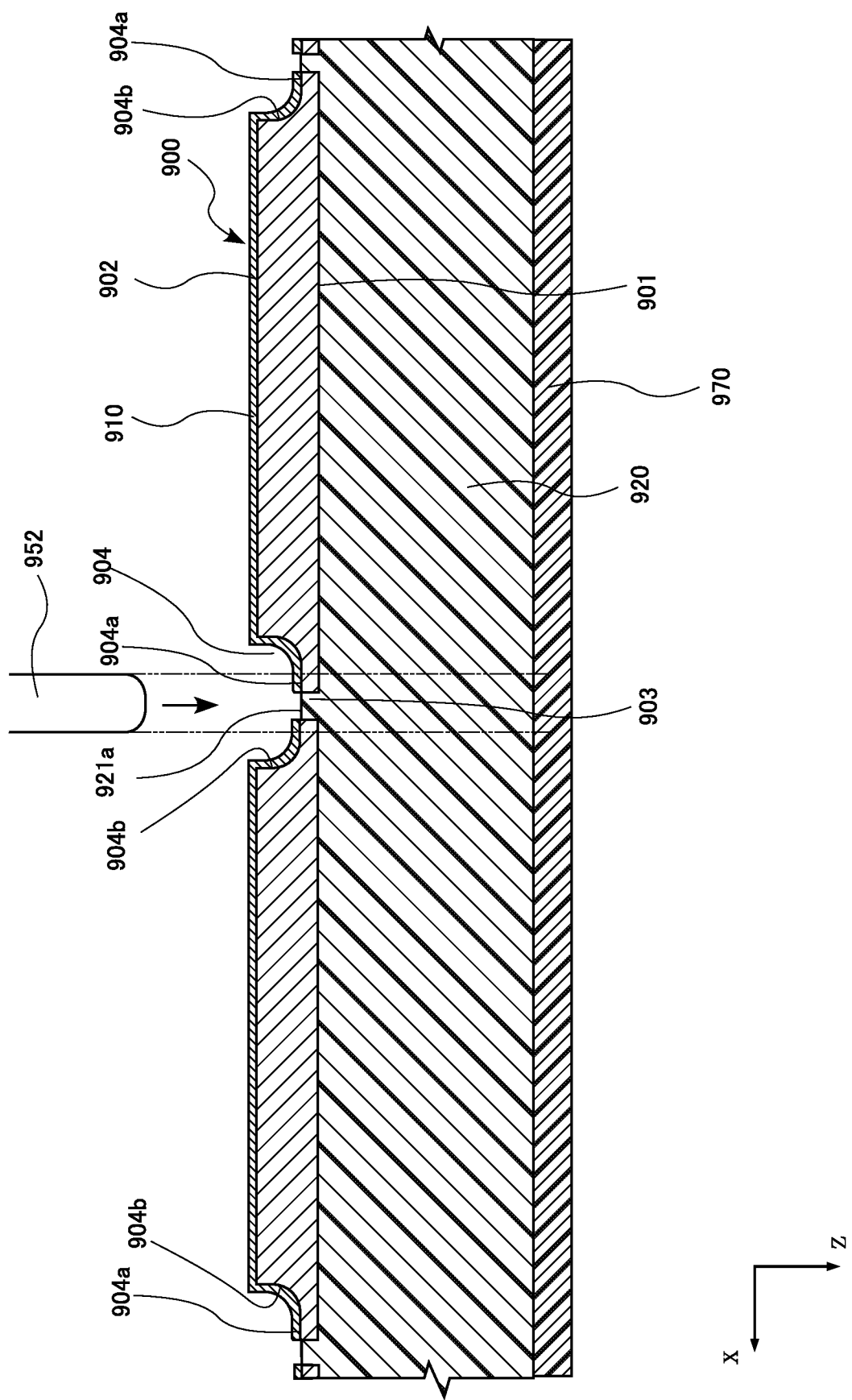
FIG. 14 is a cross-sectional view for explaining the manufacturing process of the semiconductor device shown in FIG. 1.

Proceeding to FIG. 14, a plating layer 910 is formed (plating process). The plating layer 910 can be formed by electrolytic plating using the lead frame 900 as the conductive path. The plating layer 910 is formed over a region corresponding to the reverse face 902 of the lead frame 900, and the bottom face 904*a* and the side faces 904*b* of the groove 904. In this embodiment, the plating layer 910 is formed by stacking a Ni-plating layer, a Pd-plating layer, and a Au-plating layer in this order. The plating layer 910 formed on the region of the lead frame 900 to be formed into the first lead 1 becomes the plating layer 140, the plating layer 910 formed in the region to be formed into the second lead 2 becomes the plating layer 240, and the plating layer 910 formed in the region to be formed into the third lead 3 becomes the plating layer 340.

Then a protective tape 970 is stuck to a surface of the sealing resin 920 (surface oriented to the same side as the obverse face 901 of the lead frame 900), as shown in FIG. 14. The protective tape 970 is for preventing the individual pieces, produced after the first cutting process and the second cutting process to be subsequently described, from coming apart.

Figure 15:
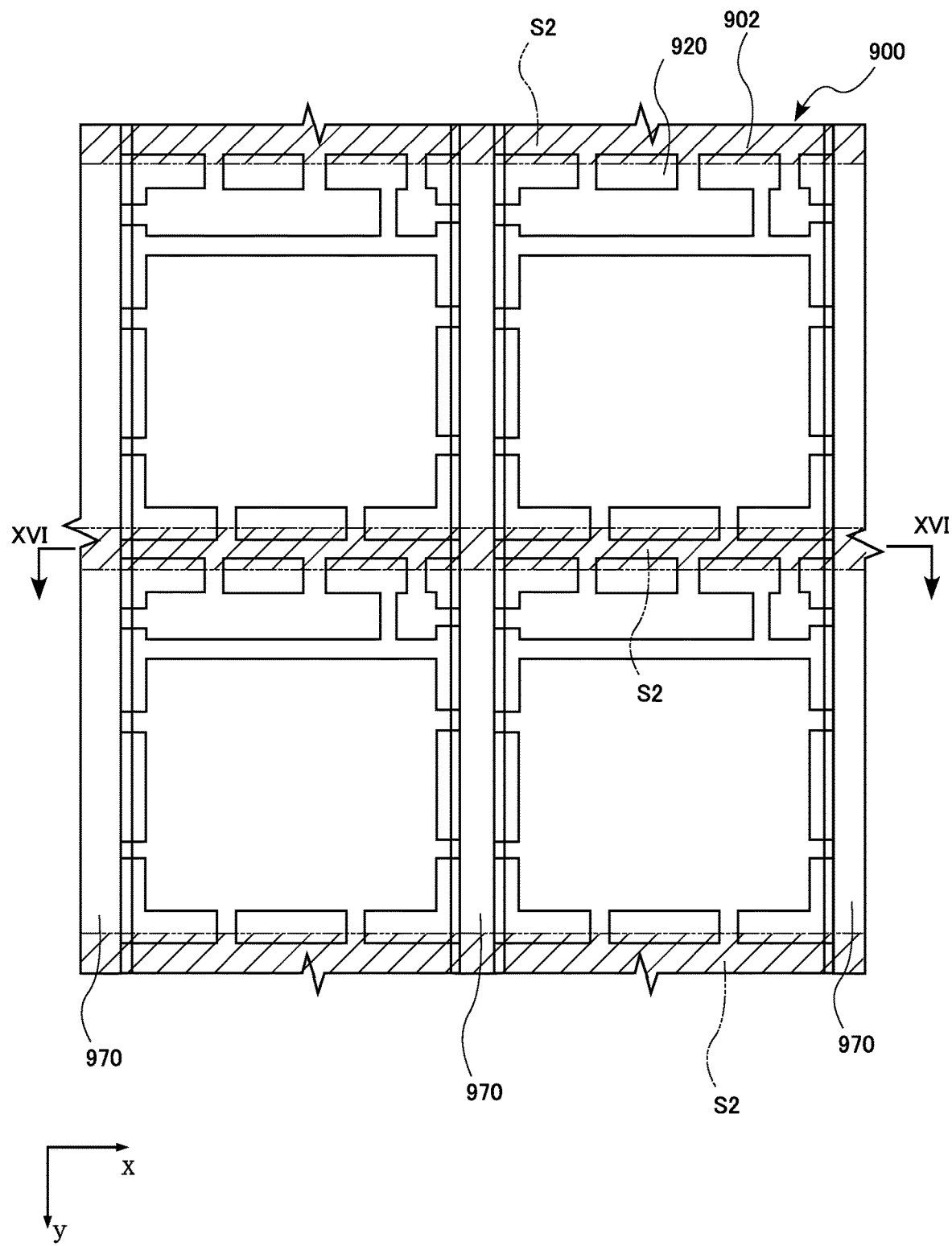
FIG. 15 is a bottom view for explaining the manufacturing process of the semiconductor device shown in FIG. 1.
Figure 16:
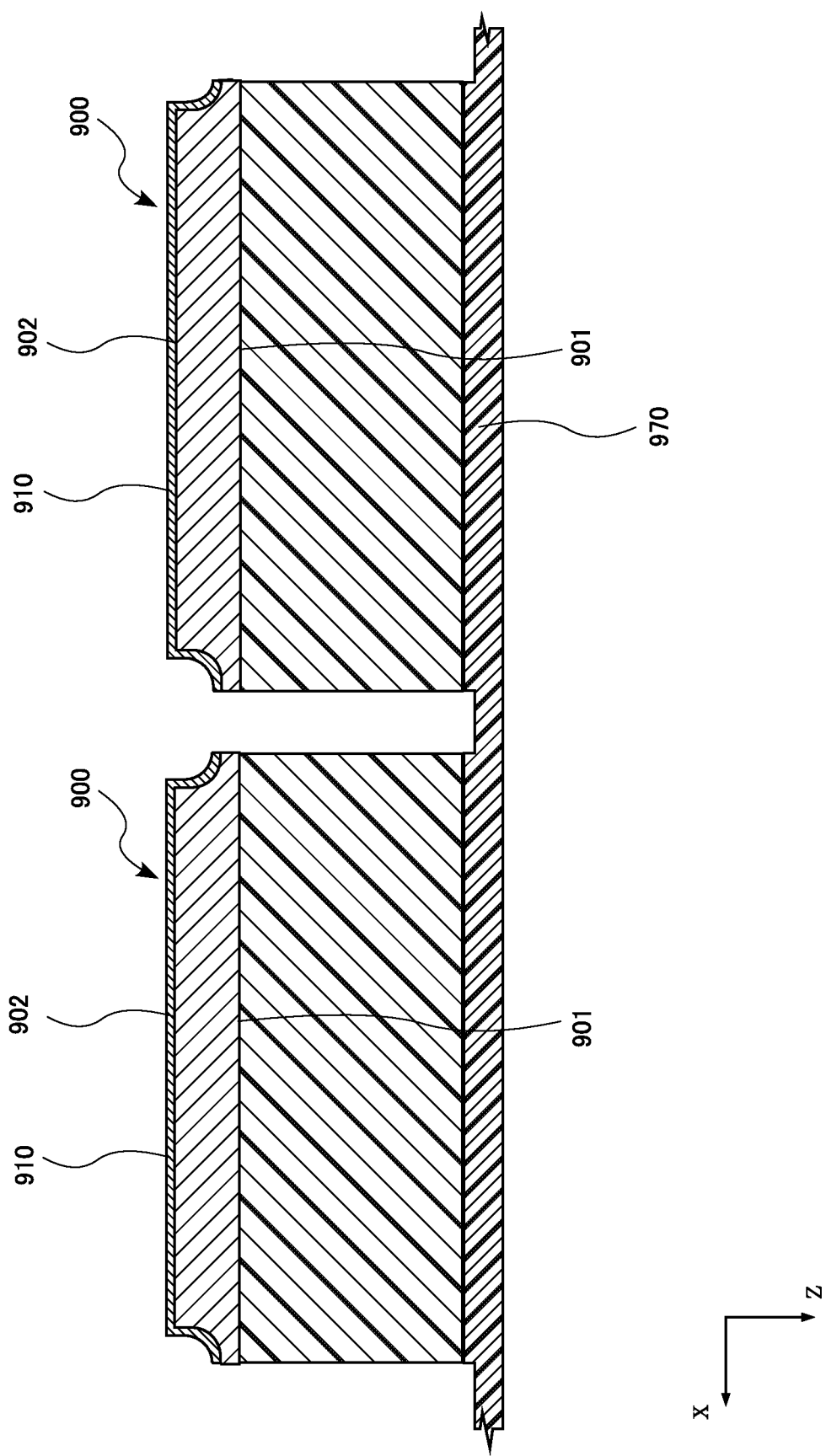
FIG. 16 is a cross-sectional view taken along a line XVI-XVI in FIG. 15.

Proceeding to FIG. 15 and FIG. 16, the lead frame 900 and the sealing resin 920 are cut along the y-direction, so as not to divide the protective tape 970 (first cutting process). In this embodiment, the first cutting process includes, as shown in FIG. 14, a full-cut dicing process that uses a second blade 952 to cut the lead frame 900 from the side of the reverse face 902. The thickness (size in the x-direction) of the second blade 952 is determined according to the size of the first disposal region S1 in the x-direction, and is thinner than the first blade 951. The full-cut dicing includes cutting the lead frame 900 and the sealing resin 920 at the position corresponding to the first disposal region S1 shown in FIG. 7, from the side of the reverse face 902 until reaching the protective tape 970, with reference to the end face 921*a* of the sealing resin 920 exposed in the bottom face 904*a* of the groove 904 (recess 903 exposed from the bottom face 904*a*). Accordingly, the respective portions of the lead frame 900 and the sealing resin 920, overlapping with the first disposal region S1 as viewed in the z-direction, are entirely removed along the z-direction. Thus, cut sections each oriented in the x-direction are formed on the lead frame 900. Out of these cut sections, the cut section formed at the position corresponding to the second terminal section 130 of the first lead 1 becomes the second terminal section end face 133, the cut section formed at the position corresponding to the second terminal section 230 of the second lead 2 becomes the second terminal section end face 233, and the cut section formed at the position corresponding to the second terminal section 330 of the third lead 3 becomes the second terminal section end face 333. Further, the cut section formed on the sealing resin 920 becomes the resin second side face 84. Here, other methods than the full-cut dicing with the blade may be adopted, in the first cutting process. For example, a plasma dicing or laser dicing process may be performed, in the first cutting process. Through the first cutting process, the lead frame 900 and the sealing resin 920 are divided in the x-direction.

Then the lead frame 900 and the sealing resin 920 are cut along the x-direction, so as not to divide the protective tape 970 (second cutting process). In this embodiment, the second cutting process includes the full-cut dicing process that uses the second blade 952 to cut the lead frame 900 from the side of the reverse face 902. In this full-cut dicing process, the portion corresponding to the second disposal region S2 shown in FIG. 15 (same as the second disposal region S2 in FIG. 7) is cut from the side of the reverse face 902, with reference to the alignment marks formed at the predetermined positions on the lead frame 900. Accordingly, the respective portions of the lead frame 900 and the sealing resin 920, overlapping with the second disposal region S2 as viewed in the z-direction, are entirely removed along the z-direction. Thus, cut sections each oriented in the y-direction are formed on the lead frame 900. Out of these cut sections, the cut section formed at the position corresponding to the first terminal section 120 of the first lead 1 becomes the first terminal section end face 123, the cut section formed at the position corresponding to the first terminal section 220 of the second lead 2 becomes the first terminal section end face 223, and the cut section formed at the position corresponding to the first terminal section 320 of the third lead 3 becomes the first terminal section end face 323. Further, the cut section formed on the sealing resin 920 becomes the resin first side face 83. Here, other methods than the full-cut dicing with the blade may be adopted, in the second cutting process. For example, a plasma dicing or laser dicing process may be performed, in the second cutting process. Through the second cutting process, the lead frame 900 and the sealing resin 920 are divided in the x-direction, and a plurality of individual pieces each having the semiconductor element 6 are connected via the protective tape 970.

Then the protective tape 970 is separated from the sealing resin 920. At this point, the plurality of individual pieces each having the semiconductor element 6 are divided into independent pieces. Through the foregoing process, the semiconductor device A1 shown in FIG. 1 to FIG. 6 can be formed.

The mentioned manufacturing method of the semiconductor device A1 provides the following advantageous effects.

In the first cutting process according to this embodiment, the full-cut dicing process is performed with reference to the end face 921*a* of the sealing resin 920 exposed in the bottom face 904*a* of the groove 904 (see FIG. 14). The end face 921*a* corresponds to the filled portion 921 of the sealing resin 920, filled in the recess 903 located at the center of the first disposal region S1 of the lead frame 900 in the x-direction, and exposed from the bottom face 904*a* of the groove 904. Accordingly, the end face 921*a* indicates the central position of the first disposal region S1 in the x-direction. Since the cutting is performed with reference to the end face 921*a* in the first cutting process, higher accuracy can be attained compared with the case of utilizing the alignment mark as reference, and an error in the cutting position can be minimized. Therefore, the total of an error corresponding to a maximum tolerance in the groove forming process and an error corresponding to the maximum tolerance in the opposite direction in the first cutting process becomes smaller, compared with the case where the alignment mark is employed as the reference in the first cutting process. Consequently, a positional shift of the cutting position with respect to the groove 904 can be minimized and, for example, the second terminal section recess 334 of the third lead 3 can be prevented from becoming excessively small beyond a permissible extent.

According to this embodiment, the recess 903 has the open end on the side of the obverse face 901, and the resin material is filled in the recess 903 in the resin forming process, so that the filled portion 921 of the sealing resin 920 is formed. Such an arrangement allows the end face 921a to be exposed from the bottom face 904a of the groove 904, through the half-cut dicing in the groove forming process.

According to this embodiment, the sealing resin 920 is formed of a black epoxy resin. Therefore, the end face 921a exposed from the bottom face 904a of the groove 904 is easy to be visually recognized, for example by image recognition. In other words, the end face 921a can be suitably utilized as the reference, in the first cutting process.

Figure 17:
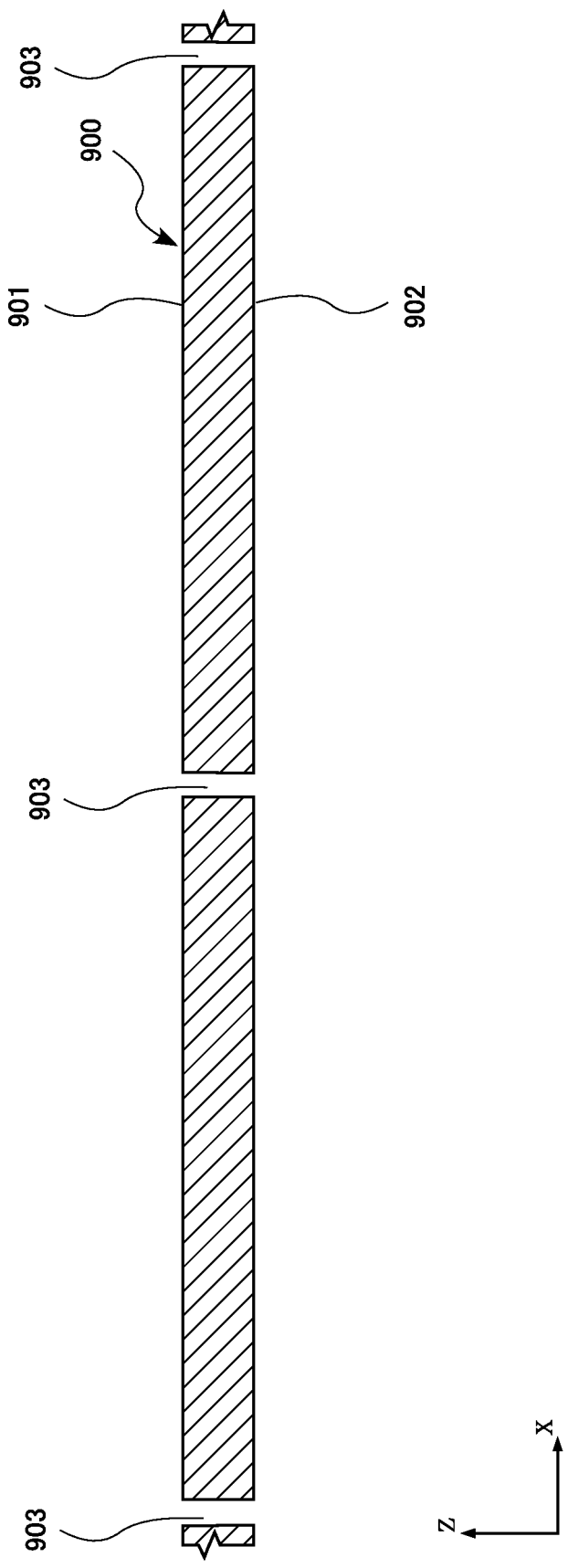
FIG. 17 is a cross-sectional view for explaining a first variation of the manufacturing process of the semiconductor device shown in FIG. 1.
Figure 18:
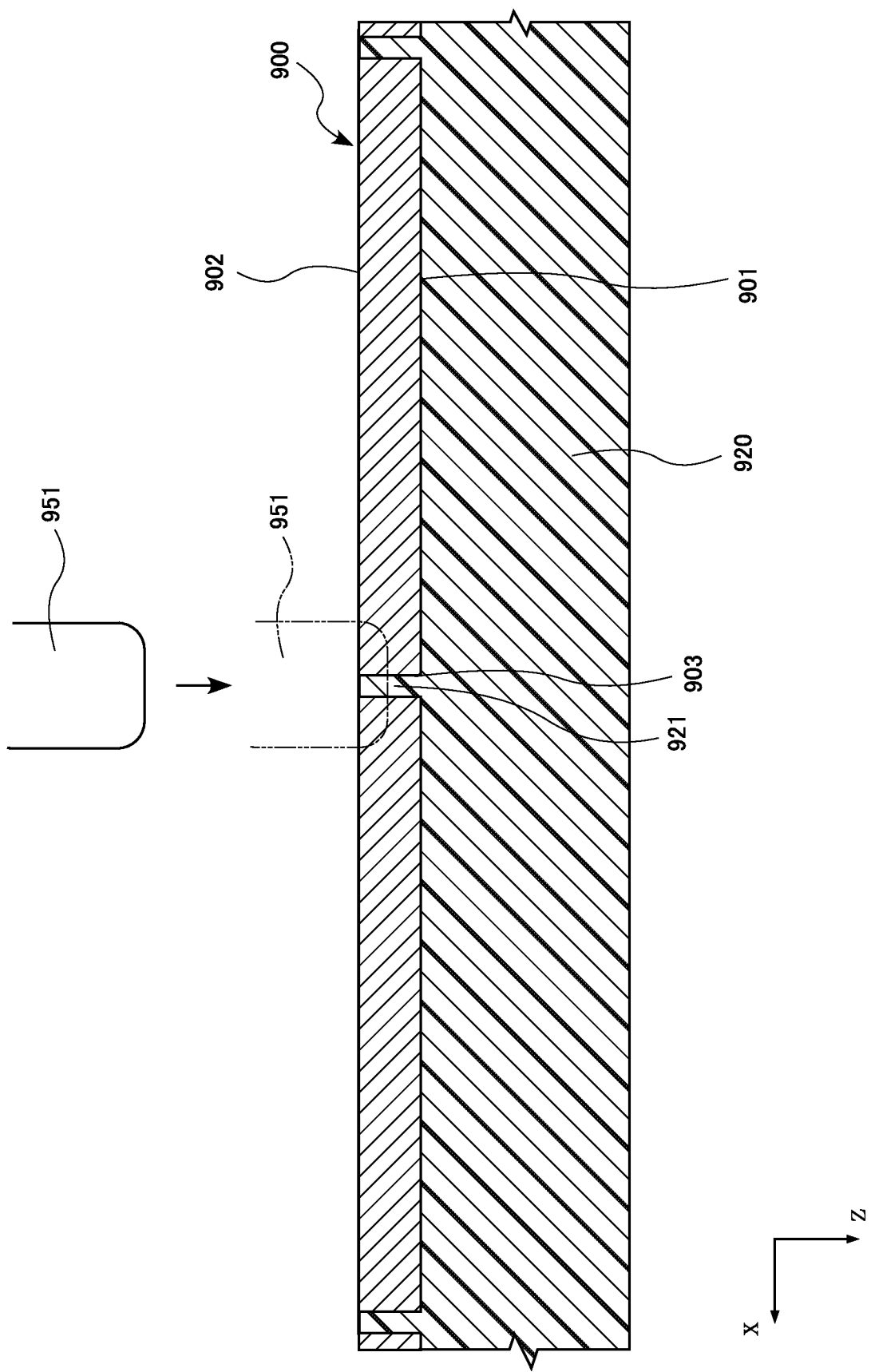
FIG. 18 is a cross-sectional view for explaining the first variation of the manufacturing process of the semiconductor device shown in FIG. 1.

Referring now to FIG. 17 and FIG. 18, a first variation of the manufacturing method of the semiconductor device A1 will be described.

In this variation, as shown in FIG. 17, the recess 903 is formed all the way through the lead frame 900, from the obverse face 901 to the reverse face 902. In other words, the recess 903 has the open end on the side of both the obverse face 901 and the reverse face 902, thus becoming a hole 903. In this variation the hole 903 is, for example, formed through an etching process, but a different method may be adopted to form the hole 903.

As shown in FIG. 18, the resin material is filled in the hole 903, so that the filled portion 921 is formed in each of the recesses 903, in the resin forming process. Since the hole 903 extends as far as the reverse face 902, the filled portion 921 is exposed from the reverse face 902. Since the sealing resin 920 is formed of a black epoxy resin in this variation, the filled portion 921 appears on the reverse face 902 of the lead frame 900, as a mark easy to be visually recognized. In the groove forming process, the half-cut dicing process is performed from the side of the reverse face 902, with reference to the filled portion 921 exposed from the reverse face 902. In this half-cut dicing process, the cutting is performed to a position halfway of the lead frame 900 in the z-direction (see first blade 951 indicated by dash-dot-dot lines in FIG. 18). Since the filled portion 921 is exposed from the reverse face 902 from the beginning, the cutting depth in the half-cut dicing process is not specifically limited, unless the cutting is performed so as to reach the obverse face 901. Through the groove forming process the groove 904 is formed, and the hole 903 is exposed from the bottom face 904a of the groove 904. In addition, the end face 921a is formed on the filled portion 921 of the sealing resin 920, and exposed from the bottom face 904a of the groove 904.

This variation also provides the same advantageous effects as those provided by the first embodiment. In the groove forming process according to this variation, the groove 904 is formed through the half-cut dicing process, performed with reference to the filled portion 921 exposed from the reverse face 902. Accordingly, higher accuracy can be attained compared with the case of forming the groove 904 with reference to the alignment mark, and an error in the forming position of the groove 904 can be minimized. Therefore, the total of an error corresponding to a maximum tolerance in the groove forming process and an error corresponding to the maximum tolerance in the opposite direction in the first cutting process becomes smaller, compared with the case where the alignment mark is employed as the reference in the groove forming process. Consequently, a positional shift of the cutting position with respect to the groove 904 can be further minimized and, for example, the second terminal section recess 334 of the third lead 3 can be prevented from becoming excessively small beyond a permissible extent.

Figure 19:
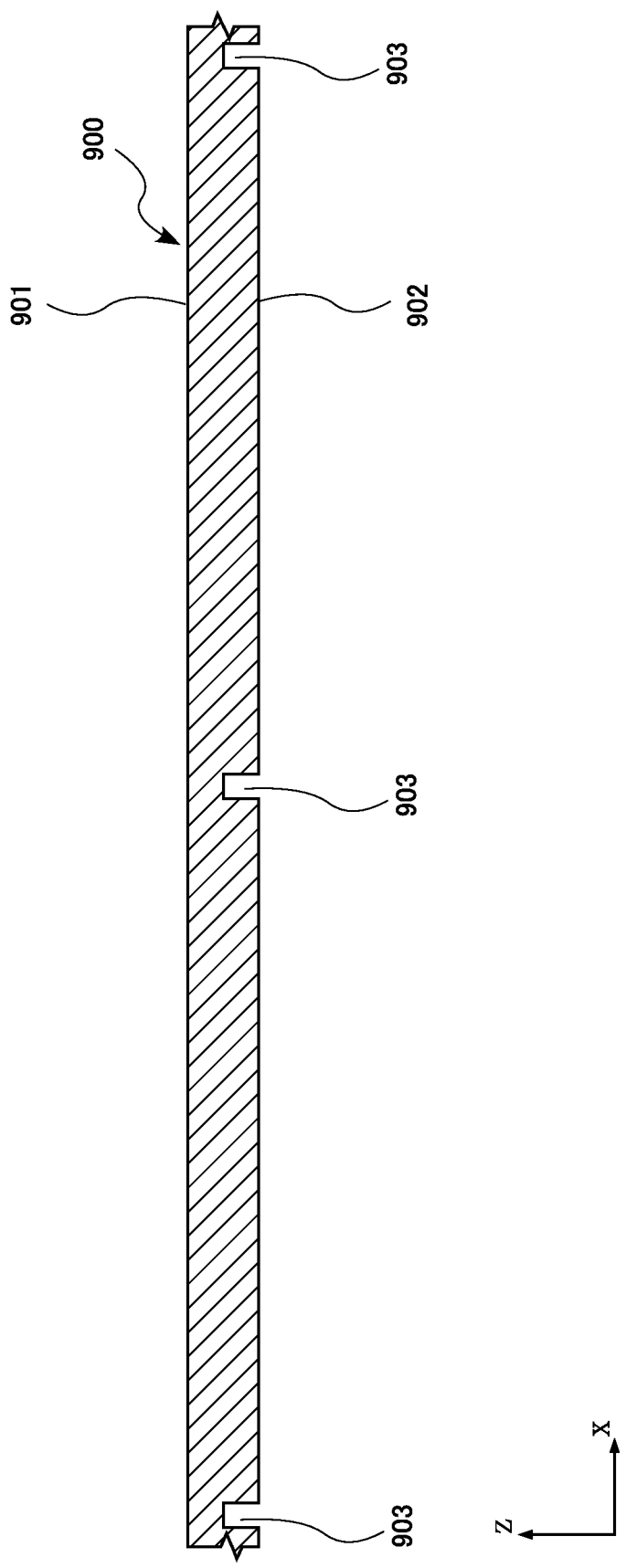
FIG. 19 is a cross-sectional view for explaining a second variation of the manufacturing process of the semiconductor device shown in FIG. 1.
Figure 20:
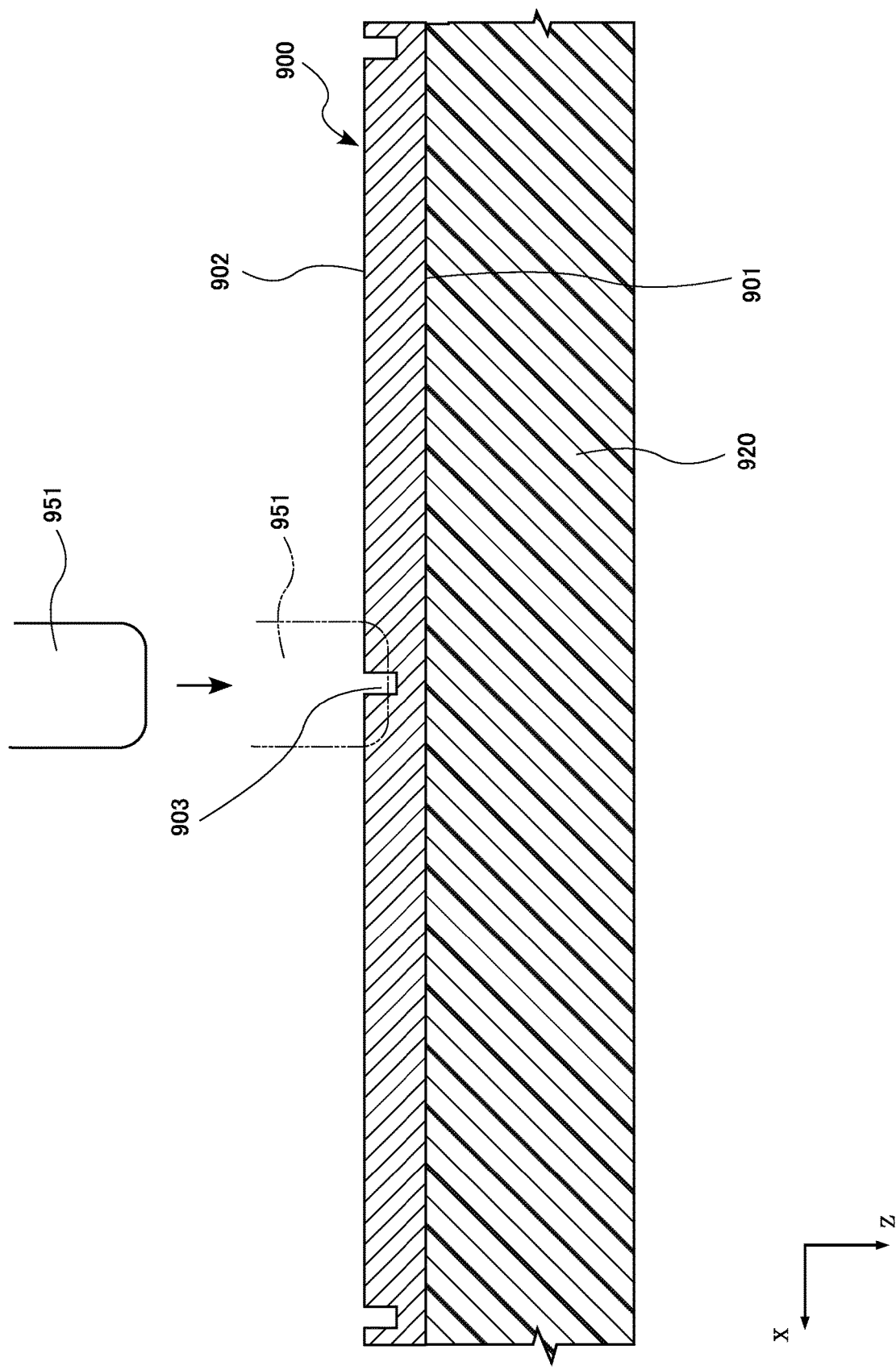
FIG. 20 is a cross-sectional view for explaining the second variation of the manufacturing process of the semiconductor device shown in FIG. 1.

Referring to FIG. 19 and FIG. 20, a second variation of the manufacturing method of the semiconductor device A1 will be described.

In this variation, as shown in FIG. 19, the recess 903 is recessed from the reverse face 902 of the lead frame 900, toward the obverse face 901. Thus, the recess 903 has the open end on the side of the reverse face 902. In this variation, the recess 903 is formed by half etching performed from the side of the reverse face 902. In the illustrated example, the depth (size in the z-direction) of the recess 903 is half a thickness (size in the z-direction) of the lead frame 900. The recess 903 may be formed, for example, by stamping.

As shown in FIG. 20, the resin material is not filled in the recess 903 in the resin forming process, and therefore the sealing resin 920 does not include the filled portion 921 formed as above. In the groove forming process, the half-cut dicing is performed from the side of the reverse face 902, with reference to the recess 903 formed on the side of the reverse face 902. In this half-cut dicing process, the cutting is performed to a position shallower than the depth of the recess 903 of the lead frame 900, in the z-direction (see first blade 951 indicated by dash-dot-dot lines in FIG. 20). In this embodiment, the cutting is performed to a depth equal to or shallower than the thickness (size in the z-direction) of the lead frame 900. Accordingly, the groove 904 becomes shallower than the recess 903, in the z-direction. Consequently, a part of the recess 903 remains, thus to be exposed in the bottom face 904a of the groove 904. In the first cutting process, the full-cut dicing is performed from the side of the reverse face 902, with reference to the recess 903 exposed in the bottom face 904a of the groove 904.

According to this variation, in the first cutting process the full-cut dicing is performed with reference to the recess 903 exposed in the bottom face 904a of the groove 904. Therefore, higher accuracy can be attained compared with the case of utilizing the alignment mark as reference, and an error in the cutting position can be minimized. According to this variation, further, in the groove forming process the half-cut dicing is performed with reference to the recess 903 formed on the side of the reverse face 902, to form the groove 904. Accordingly, higher accuracy can be attained compared with the case of forming the groove 904 with reference to the alignment mark, and an error in the forming position of the groove 904 can be minimized. Therefore, the total of an error corresponding to a maximum tolerance in the groove forming process and an error corresponding to the maximum tolerance in the opposite direction in the first cutting process becomes smaller, compared with the case where the alignment mark is employed as the reference in the groove forming process and the first cutting process. Consequently, a positional shift of the cutting position with respect to the groove 904 can be minimized and, for example, the second terminal section recess 334 of the third lead 3 can be prevented from becoming excessively small beyond a permissible extent.

Figure 21:
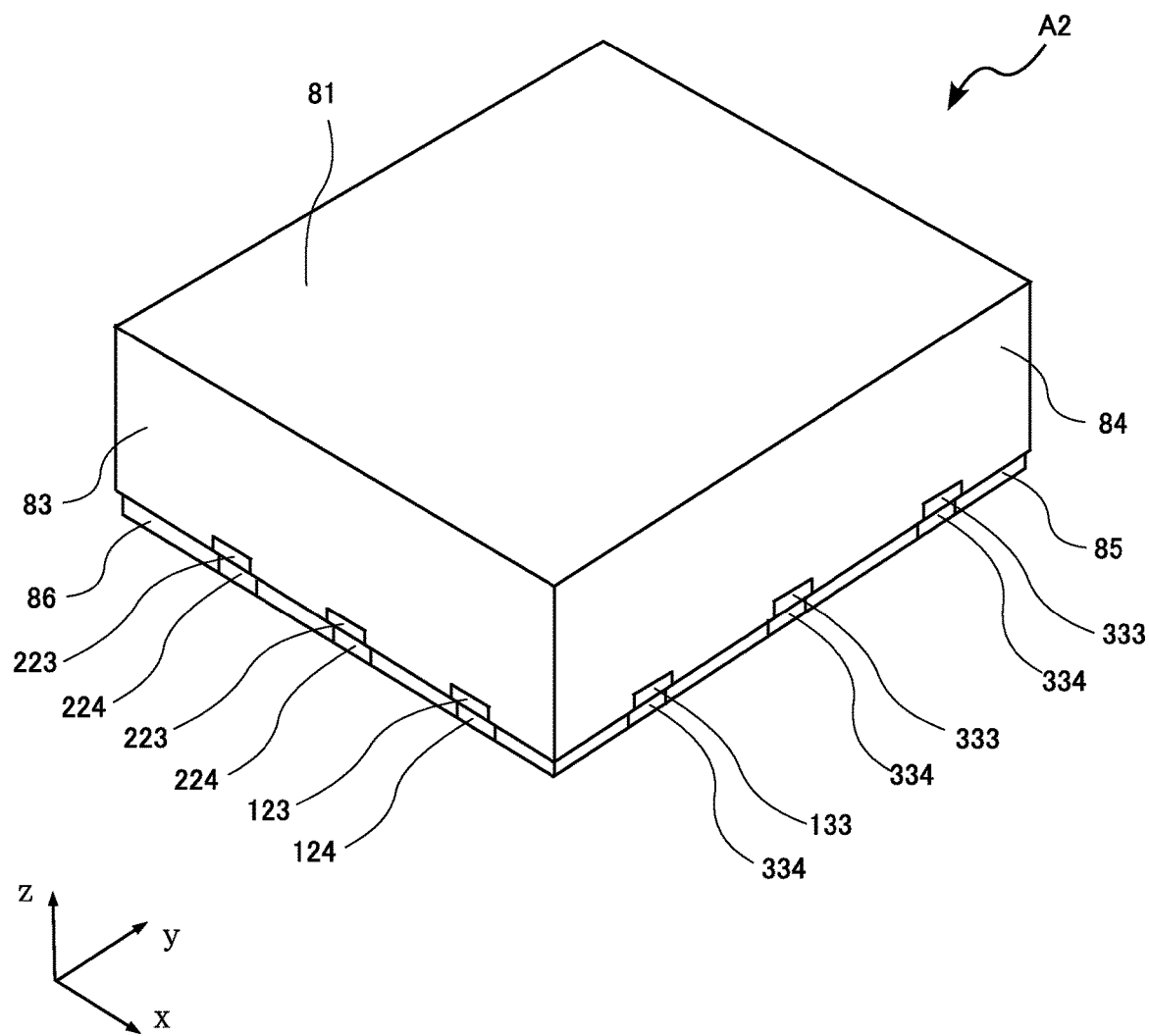
FIG. 21 is a perspective view showing a semiconductor device according to a second embodiment of the present disclosure.
Figure 22:
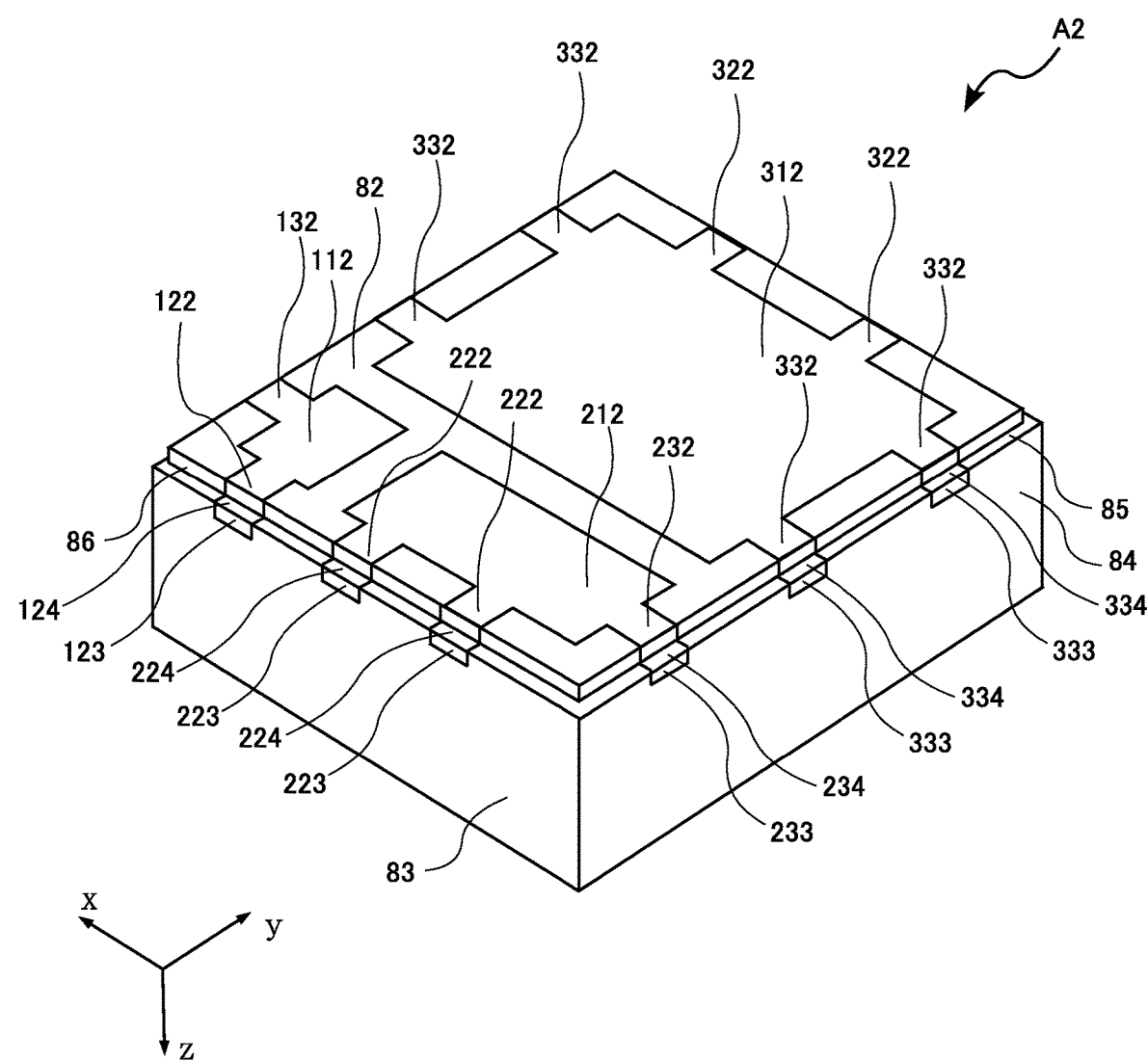
FIG. 22 is a perspective view showing the semiconductor device shown in FIG. 21, with the bottom face oriented upward.
Figure 23:
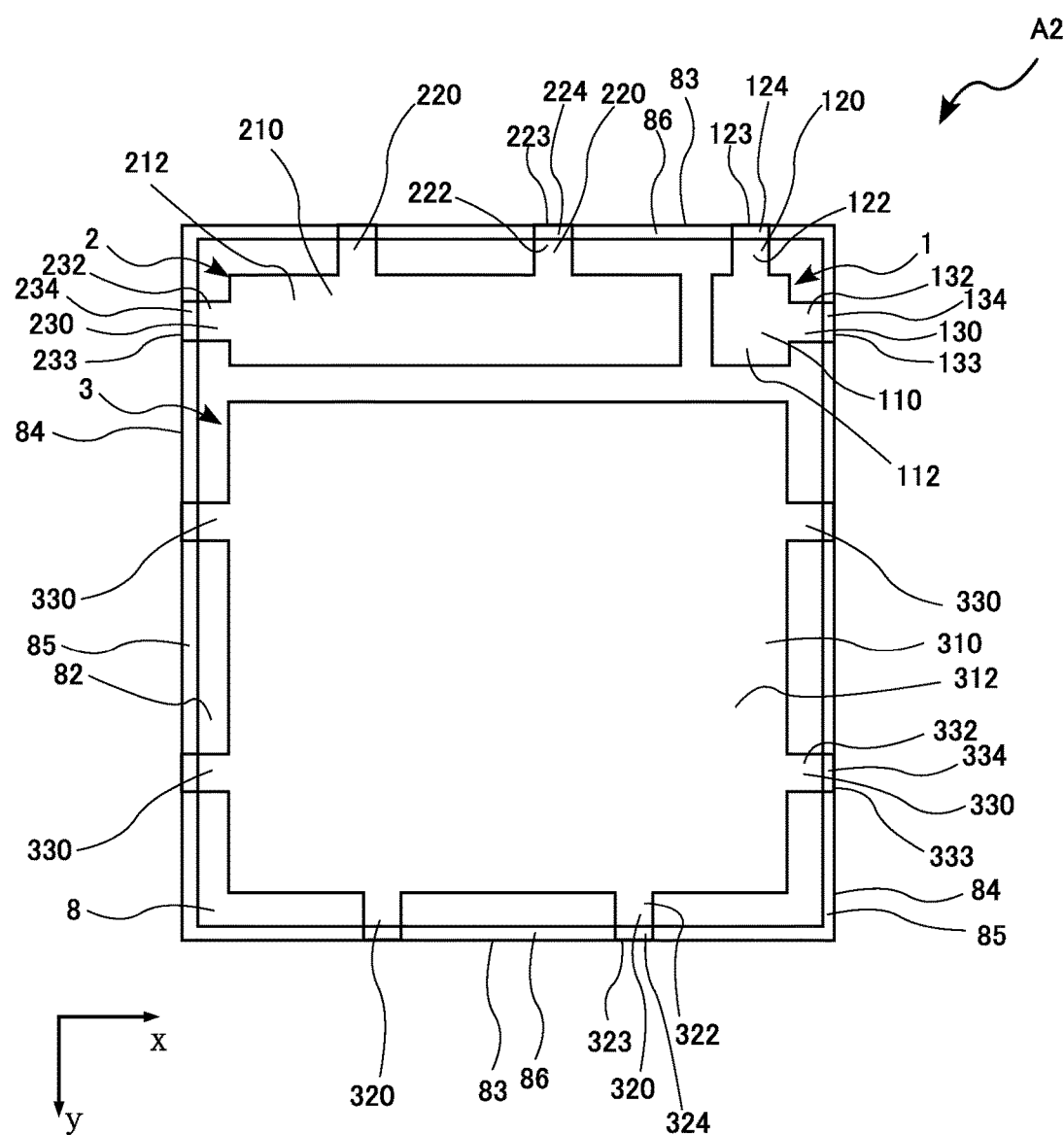
FIG. 23 is a bottom view of the semiconductor device shown in FIG. 21.
Figure 24:
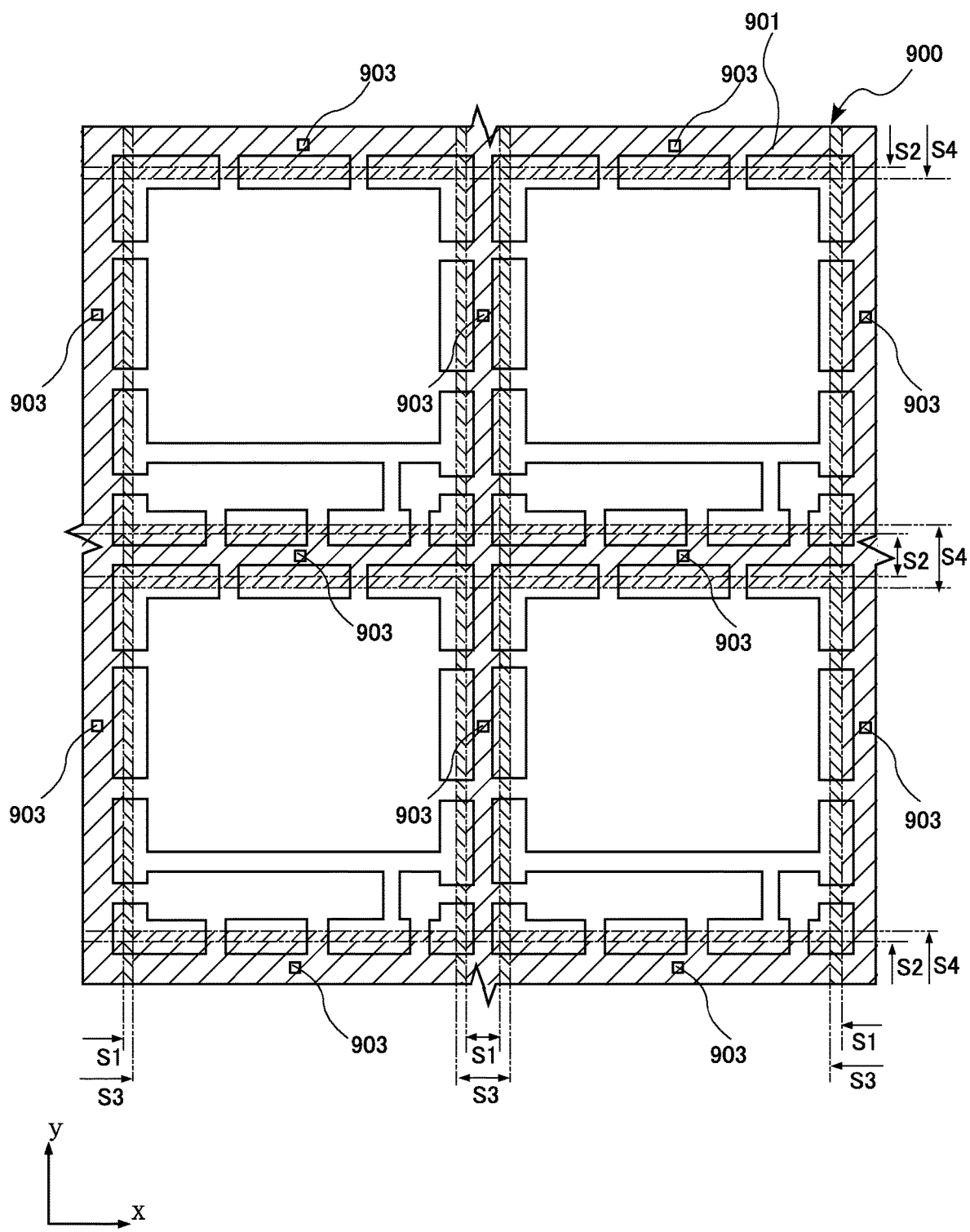
FIG. 24 is a plan view for explaining a manufacturing process of the semiconductor device shown in FIG. 21.
Figure 25:
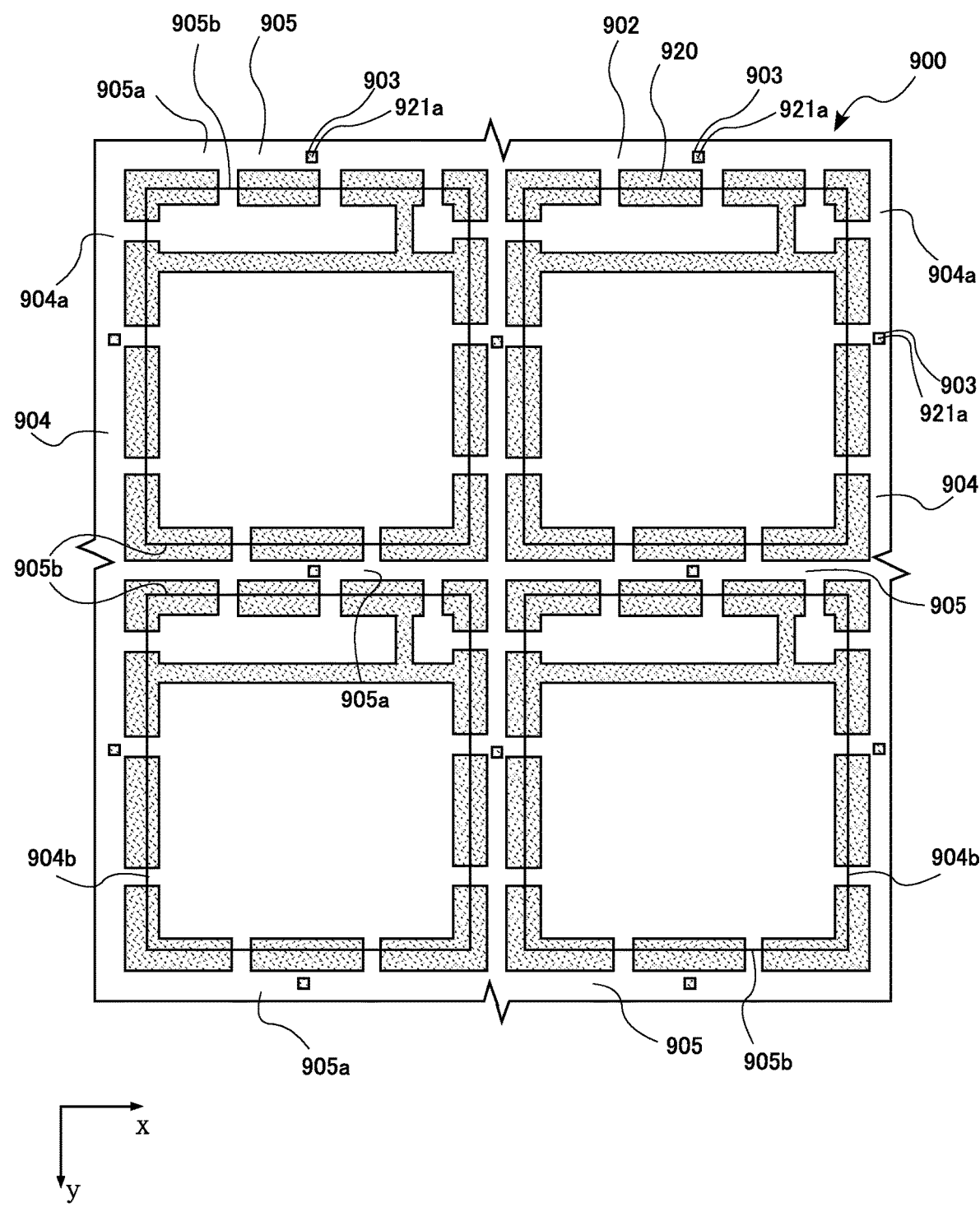
FIG. 25 is a bottom view for explaining the manufacturing process of the semiconductor device shown in FIG. 21.

Referring to FIG. 21 to FIG. 25, a semiconductor device A2 according to a second embodiment of the present disclosure will be described. In the mentioned drawings, the elements same as or similar to those of the semiconductor device A1 are given the same numeral, and the description thereof will not be repeated. FIG. 21 is a perspective view showing the semiconductor device A2. FIG. 22 is a perspective view showing the semiconductor device A2, with the bottom face oriented upward. FIG. 23 is a bottom view of the semiconductor device A2. FIG. 24 is a plan view for explaining a manufacturing process of the semiconductor device A2. FIG. 25 is a bottom view for explaining the manufacturing process of the semiconductor device A2.

The semiconductor device A2 is different from the semiconductor device A1, in that the recess on the side of the bottom face is formed along each end portion in the y-direction, in addition to the end portions in the x-direction.

In this embodiment, the first terminal section 320 of the third lead 3 further includes a first terminal section recess 324. The first terminal section recess 324 is recessed from the first terminal section reverse face 322 toward the first terminal section obverse face 321, and formed along the outer edge of the first terminal section reverse face 322 in the y-direction, so as to extend all the way to both ends in the x-direction. The first terminal section recess 324 is connected to the first terminal section reverse face 322 and the first terminal section end face 323. The first terminal section recess 324 is formed by half-cut dicing in a second groove forming process of the manufacturing process to be subsequently described. The first terminal section recess 324 is also exposed from the sealing resin 8, and covered with the plating layer 340.

In this embodiment, the first terminal section 120 of the first lead 1 further includes a first terminal section recess 124. The first terminal section recess 124 is recessed from the first terminal section reverse face 122 toward the first terminal section obverse face 121, and formed along the outer edge of the first terminal section reverse face 122 in the y-direction, so as to extend all the way to both ends in the x-direction. The first terminal section recess 124 is connected to the first terminal section reverse face 122 and the first terminal section end face 123. The first terminal section recess 124 is formed by half-cut dicing in the second groove forming process of the manufacturing process to be subsequently described. The first terminal section recess 124 is also exposed from the sealing resin 8, and covered with the plating layer 140.

In this embodiment, the first terminal section 220 of the second lead 2 further includes a first terminal section recess 224. The first terminal section recess 224 is recessed from the first terminal section reverse face 222 toward the first terminal section obverse face 221, and formed along the outer edge of the first terminal section reverse face 222 in the y-direction, so as to extend all the way to both ends in the x-direction. The first terminal section recess 224 is connected to the first terminal section reverse face 222 and the first terminal section end face 223. The first terminal section recess 224 is formed by half-cut dicing in the second groove forming process of the manufacturing process to be subsequently described. The first terminal section recess 224 is also exposed from the sealing resin 8, and covered with the plating layer 240.

In this embodiment, the sealing resin 8 further includes a resin recess 86. The resin recess 86 is recessed from the resin reverse face 82 toward the resin obverse face 81, and formed along each of outer edges of the resin reverse face 82 in the y-direction, so as to extend all the way to both ends in the x-direction. The resin recess 86 is connected to the resin reverse face 82 and the resin first side face 83. The resin recess 86 is formed by half-cut dicing in the second groove forming process of the manufacturing process to be subsequently described.

Referring to FIG. 24 and FIG. 25, an example of the manufacturing method of the semiconductor device A2 will be described hereunder. The description of the same processes as those of the manufacturing method of the semiconductor device A1 according to the first embodiment will not be repeated.

As shown in FIG. 24, the lead frame 900 is prepared. In the lead frame 900 according to this embodiment, second groove forming regions S4 are further defined. The second groove forming regions S4 are illustrated in FIG. 24 as a combined region of relatively densely hatched portions extending in the x-direction, and relatively sparsely hatched portions extending in the x-direction (second disposal region S2), where grooves are to be formed on the reverse face 902 in the second groove forming process to be subsequently described. The second groove forming regions S4 are each defined so as to extend in the x-direction, between the regions of the lead frame 900 aligned adjacent to each other, in each of which the semiconductor device A2 is to be formed. The second groove forming region S4 is wider than the second disposal region S2 in the y-direction, and includes the second disposal region S2 along the center in the y-direction. In other words, the second disposal region S2 is narrower than the second groove forming region S4, and the entirety of the second disposal region S2 overlaps with the second groove forming region S4.

In this embodiment, the location of the plurality of recesses 903 formed on the lead frame 900 are different from that of the first embodiment. The plurality of recesses 903 are each located along the first disposal region S1 or the second disposal region S2. The recesses 903 located along the first disposal region S1 are positioned at the center thereof in the x-direction. The recesses 903 located along the second disposal region S2 are positioned at the center thereof in the y-direction. The recesses 903 are located in the region other than the intersection between the first disposal region S1 and the second disposal region S2. The position and the number of the recesses 903 are not specifically limited.

Then the semiconductor element 6 is mounted on the lead frame 900 (mounting process), the sealing resin 920 is formed (resin forming process), and the grooves 904 are formed (groove forming process). These processes are similar to those of the first embodiment.

Proceeding to FIG. 25, grooves 905 are formed (second groove forming process). The grooves 905 are each recessed from the reverse face 902 of the lead frame 900 toward the obverse face 901, and formed along the position corresponding to the second groove forming region S4 shown in FIG. 24, so as to extend in the x-direction. As shown in FIG. 25, the grooves 905 are formed so as to stride over the lead frame 900 and the sealing resin 920. The grooves 905 each include a bottom face 905a and a side face 905b. The bottom face 905a is oriented to the same side as the reverse face 902 of the lead frame 900. The side face 905b is connected to the reverse face 902 of the lead frame 900, the face of the sealing resin 920 oriented to the same side as the reverse face 902, and the bottom face 905a. The groove 905 formed in the region of the lead frame 900 to be formed into the first terminal section 120 of the first lead 1 becomes the first terminal section recess 124, the groove 905 formed in the region to be formed into the first terminal section 220 of the second lead 2 becomes the first terminal section recess 224, and the groove 905 formed in the region to be formed into the first terminal section 320 of the third lead 3 becomes the first terminal section recess 324. In addition, a part of the groove 905 formed in the sealing resin 920 becomes the resin recess 86.

The second groove forming process includes, like the groove forming process, the half-cut dicing process that uses the first blade 951 to cut the reverse face 902 of the lead frame 900. In this half-cut dicing process, the portion corresponding to the groove forming region S4 shown in FIG. 24 is cut from the side of the reverse face 902, with reference to the alignment marks formed at predetermined positions on the lead frame 900. In the half-cut dicing process, in addition, the cutting is performed to a position halfway of the lead frame 900 in the z-direction, and until reaching and exposing the recess 903 (until reaching the filled portion 921 of the sealing resin 920). In this embodiment, the cutting is performed to a depth equal to or deeper than half a thickness (size in the z-direction) of the lead frame 900, for example approximately two thirds of the thickness of the lead frame 900. Accordingly, the bottom face 905a of the groove 905 is connected to the recess 903, so that the recess 903 is exposed from the bottom face 905a. Further, the end face 921a is formed on the filled portion 921 of the sealing resin 920, and exposed from the bottom face 905a of the groove 905. Since the sealing resin 920 is formed of a black epoxy resin in this embodiment, the end face 921a appears in the bottom face 905a of the groove 905, as a mark easy to be visually recognized. Here, in the second groove forming process, other methods than the half-cut dicing with the blade may be adopted, to form the groove 905.

Then the plating layer 910 is formed (plating process), the protective tape 970 is stuck, and the lead frame 900 and the sealing resin 920 are cut along the y-direction (first cutting process). These processes are similar to those of the first embodiment.

Then the lead frame 900 and the sealing resin 920 are cut along the x-direction, so as not to cut the protective tape 970 (second cutting process). In this embodiment also, the second cutting process includes the full-cut dicing process that uses the second blade 952 to cut the lead frame 900 from the side of the reverse face 902. This full-cut dicing includes cutting the lead frame 900 and the sealing resin 920 at the position corresponding to the second disposal region S2 shown in FIG. 24, from the side of the reverse face 902 until reaching the protective tape 970, with reference to the end face 921a of the sealing resin 920 exposed in the bottom face 905a of the groove 905 (recess 903 exposed from the bottom face 905a). Accordingly, the respective portions of the lead frame 900 and the sealing resin 920, overlapping with the second disposal region S2 as viewed in the z-direction, are entirely removed along the z-direction. Thus, cut sections each oriented in the y-direction are formed on the lead frame 900. Through the second cutting process, the lead frame 900 and the sealing resin 920 are divided in the y-direction, and a plurality of individual pieces each having the semiconductor element 6 are connected via the protective tape 970.

Then the protective tape 970 is separated. At this point, the plurality of individual pieces each having the semiconductor element 6 are divided into independent pieces. Through the foregoing process, the semiconductor device A2 shown in FIG. 21 to FIG. 23 can be formed.

In this embodiment also, the full-cut dicing process is performed with reference to the end face 921a of the sealing resin 920 exposed in the bottom face 904a of the groove 904. Accordingly, higher accuracy can be attained compared with the case of utilizing the alignment mark as reference, and an error in the cutting position can be minimized. Therefore, the total of an error corresponding to a maximum tolerance in the groove forming process and an error corresponding to the maximum tolerance in the opposite direction in the first cutting process becomes smaller, compared with the case where the alignment mark is employed as the reference in the first cutting process. Consequently, a positional shift of the cutting position with respect to the groove 904 can be minimized and, for example, the second terminal section recess 334 of the third lead 3 can be prevented from becoming excessively small beyond a permissible extent.

According to this embodiment, the second cutting process includes the full-cut dicing process performed with reference to the end face 921a of the sealing resin 920 exposed in the bottom face 905a of the groove 905. The end face 921a corresponds to the filled portion 921 of the sealing resin 920, filled in the recess 903 located at the center of the second disposal region S2 of the lead frame 900 in the y-direction, and exposed from the bottom face 905a of the groove 905. Accordingly, the end face 921a indicates the central position of the second disposal region S2 in the y-direction. Since the cutting is performed with reference to the end face 921a in the second cutting process, higher accuracy can be attained compared with the case of utilizing the alignment mark as reference, and an error in the cutting position can be minimized. Therefore, the total of an error corresponding to a maximum tolerance in the second groove forming process and an error corresponding to the maximum tolerance in the opposite direction in the second cutting process becomes smaller, compared with the case where the alignment mark is employed as the reference in the second cutting process. Consequently, a positional shift of the cutting position with respect to the groove 905 can be minimized and, for example, the second terminal section recess 334 of the third lead 3 can be prevented from becoming excessively small beyond a permissible extent.

In this embodiment also, the recess 903 has the open end on the side of the obverse face 901. Therefore, the resin material is also filled in the recess 903 in the resin forming process, so that the filled portion 921 of the sealing resin 920 is formed. Such an arrangement allows the end face 921a to be exposed from the bottom face 904a of the groove 904, through the half-cut dicing in the groove forming process. Further, the end face 921a can be exposed from the bottom face 905a of the groove 905, by the half-cut dicing in the second groove forming process.

In this embodiment also, the sealing resin 920 is formed of a black epoxy resin. Therefore, the end face 921a exposed from the bottom face 904a of the groove 904, and from the bottom face 905a of the groove 905, is easy to be visually recognized, for example by image recognition. In other words, the end face 921a can be suitably utilized as the reference, in the first cutting process and the second cutting process.

According to this embodiment, the recesses 903 are each located in the region other than the intersection between the first disposal region S1 and the second disposal region S2. Accordingly, the recess 903 remains in the second disposal region S2, despite the first disposal region S1 having been removed in the first cutting process. In the second cutting process, therefore, the cutting can be performed with reference to the end face 921a of the sealing resin 920 remaining in the bottom face 905a of the groove 905 (recess 903 remaining in the second disposal region S2). Here, in the case where any of the recesses 903 remains even after the first disposal region S1 is removed in the first cutting process, the positions of the other recesses 903 are not specifically limited.

The manufacturing method of a semiconductor device according to the present disclosure is not limited to the foregoing embodiments. The specific arrangements of the manufacturing method according to the present disclosure may be modified in various manners.

The invention claimed is:

1. A method for manufacturing a semiconductor device, the method comprising:
    preparing a lead frame having an obverse face and a reverse face spaced apart from each other in a thickness direction;
    mounting a semiconductor element on the obverse face of the lead frame;
    forming a sealing resin covering the semiconductor element;
    forming a groove on the reverse face of the lead frame; and
    removing a portion of the lead frame and a portion of the sealing resin along a disposal region that is narrower than and overlaps with the groove as viewed in the thickness direction, the removing being performed with respect to an entirety of the lead frame and the sealing resin in the thickness direction,
    wherein the preparing of the lead frame comprises forming at least one recess in the lead frame, the recess being located in the disposal region and having an end that is open in the thickness direction,
    the forming of the groove comprises exposing the recess on a side of the reverse face of the lead frame, and
    the removing comprises cutting with reference to the recess.

2. The method according to claim 1, wherein the recess has an end that is open on a side of the obverse face of the lead frame.

3. The method according to claim 2, wherein the groove includes a bottom face oriented to a same side as the reverse face of the lead frame, and the forming of the groove comprises cutting continued until the bottom face of the groove reaches the recess.

4. The method according to claim 1, wherein the recess includes ends that are open on a side of the obverse face of the lead frame and on a side of the reverse face of the lead frame, respectively.

5. The method according to claim 2, wherein the sealing resin includes a filled portion formed in the recess.

6. The method according to claim 1, wherein the recess includes an end that is open on a side of the reverse face of the lead frame.

7. The method according to claim 6, wherein the groove is smaller in size measured in the thickness direction than the recess.

8. The method according to claim 1, wherein the preparing of the lead frame comprises forming the recess by etching.

9. The method according to claim 1, wherein the forming of the groove comprises forming the groove by a half-cut dicing process using a first blade, and
    the removing comprises performing a full-cut dicing process using a second blade thinner than the first blade.

10. The method according to claim 1, wherein the forming of the groove comprises forming a first groove extending in a first direction perpendicular to the thickness direction and a second groove perpendicular to the first groove.

11. The method according to claim 10, wherein the removing comprises a first cutting process performed on a first disposal region along the first groove and a second cutting process performed on a second disposal region along the second groove.

12. The method according to claim 11, wherein the at least one recess includes a recess formed in a region other than an intersection between the first disposal region and the second disposal region.

13. The method according to claim 1, further comprising performing a plating process after the forming of the groove,
    wherein the plating process comprises forming a plating layer on the lead frame, the plating layer covering at least the groove.

* * * * *